United States Patent
Jung et al.

(10) Patent No.: US 7,710,019 B2
(45) Date of Patent: May 4, 2010

(54) ORGANIC LIGHT-EMITTING DIODE DISPLAY COMPRISING AUXILIARY ELECTRODES

(75) Inventors: Kwang-Chul Jung, Seongnam-si (KR); Beohm-Rock Choi, Seoul (KR); Nam-Deog Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 689 days.

(21) Appl. No.: 11/557,244

(22) Filed: Nov. 7, 2006

(65) Prior Publication Data

US 2007/0063936 A1 Mar. 22, 2007

Related U.S. Application Data

(63) Continuation-in-part of application No. 11/204,042, filed on Aug. 16, 2005, which is a continuation of application No. 10/732,280, filed on Dec. 11, 2003, now Pat. No. 6,946,791.

(30) Foreign Application Priority Data

Dec. 11, 2002  (KR) .................. 10-2002-0078744
Nov. 15, 2005  (KR) .................. 10-2005-0109063

(51) Int. Cl.
*H01J 1/62* (2006.01)
*H01J 63/04* (2006.01)
*H05B 33/06* (2006.01)

(52) U.S. Cl. ............... 313/504; 313/500; 313/505; 313/506; 315/169.3; 257/82; 257/83

(58) Field of Classification Search ......... 313/498–512; 315/169.1, 169.3; 428/690–691, 917, 66, 428/532–535, 539; 438/26–29, 34, 82; 257/40, 257/72, 98–100, 642–643, 759
See application file for complete search history.

(56) References Cited

U.S. PATENT DOCUMENTS 4,489,481 A   12/1984  Jones
(Continued)

FOREIGN PATENT DOCUMENTS

CN   1366652   8/2002
(Continued)

OTHER PUBLICATIONS

Office Action dated Jan. 7, 2009 (for co-pending U.S. Appl. No. 11/204,042).
(Continued)

*Primary Examiner*—Sikha Roy
*Assistant Examiner*—Jose M Diaz
(74) *Attorney, Agent, or Firm*—H.C. Park & Associates, PLC

(57) ABSTRACT

An organic light-emitting diode (OLED) display includes a substrate, an auxiliary electrode disposed on the substrate, a first signal line disposed on the substrate, a second signal line crossing the first signal line, a driving voltage line disposed on the substrate, a first thin film transistor connected to the first signal line and the second signal line, a second thin film transistor connected to the first thin film transistor and the driving voltage line, a first electrode connected to the second thin film transistor, a second electrode facing the first electrode, and a light-emitting member disposed between the first electrode and the second electrode. The auxiliary electrode is connected to one of the driving voltage line and the second electrode.

18 Claims, 22 Drawing Sheets

U.S. PATENT DOCUMENTS

| | | | |
|---|---|---|---|
| 5,107,175 A | 4/1992 | Hirano et al. | |
| 5,124,204 A | 6/1992 | Yamashita et al. | |
| 5,189,405 A | 2/1993 | Yamashita et al. | |
| 5,455,625 A | 10/1995 | Englander | |
| 5,627,364 A | 5/1997 | Codama et al. | |
| 5,686,360 A | 11/1997 | Harvey, III et al. | |
| 5,693,956 A | 12/1997 | Shi et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,952,778 A | 9/1999 | Haskal et al. | |
| 5,973,449 A | 10/1999 | Nakamura et al. | |
| 6,127,199 A | 10/2000 | Inoue et al. | |
| 6,144,108 A | 11/2000 | Ohizumi et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,275,275 B1* | 8/2001 | Ha | 349/42 |
| 6,275,285 B1 | 8/2001 | Nottke et al. | |
| 6,281,634 B1 | 8/2001 | Yokoyama | |
| 6,287,955 B1 | 9/2001 | Wang et al. | |
| 6,329,087 B1 | 12/2001 | Okamoto | |
| 6,372,608 B1 | 4/2002 | Shimoda et al. | |
| 6,376,105 B1 | 4/2002 | Jones et al. | |
| 6,413,645 B1 | 7/2002 | Graff et al. | |
| 6,475,845 B2 | 11/2002 | Kimura | |
| 6,522,067 B1 | 2/2003 | Graff et al. | |
| 6,541,294 B1 | 4/2003 | Yamazaki et al. | |
| 6,586,772 B2 | 7/2003 | Bijilsma | |
| 6,590,227 B2* | 7/2003 | Ishikawa | 257/68 |
| 6,597,121 B2 | 7/2003 | Imura | |
| 6,597,413 B2 | 7/2003 | Kurashina | |
| 6,614,174 B1 | 9/2003 | Urabe | |
| 6,639,360 B2 | 10/2003 | Roberts et al. | |
| 6,682,963 B2 | 1/2004 | Ishikawa | |
| 6,771,677 B2 | 8/2004 | Furukawa et al. | |
| 6,806,643 B2 | 10/2004 | Hayashi | |
| 6,828,726 B2 | 12/2004 | Sakurai et al. | |
| 6,921,918 B2 | 7/2005 | Park | |
| 6,946,791 B2 | 9/2005 | Choi et al. | |
| 6,982,524 B2 | 1/2006 | Park | |
| 7,098,473 B2* | 8/2006 | Lee et al. | 257/40 |
| 7,173,372 B2 | 2/2007 | Koo | |
| 7,372,200 B2 | 5/2008 | Yamazaki | |
| 2001/0001485 A1 | 5/2001 | Bao et al. | |
| 2001/0011726 A1 | 8/2001 | Hayashi et al. | |
| 2001/0026835 A1 | 10/2001 | Tanaka | |
| 2001/0030323 A1 | 10/2001 | Ikeda | |
| 2001/0040645 A1 | 11/2001 | Yamazaki | |
| 2002/0017643 A1 | 2/2002 | Koyama | |
| 2002/0047120 A1 | 4/2002 | Inukai | |
| 2002/0060756 A1 | 5/2002 | Kurashina | |
| 2002/0070662 A1 | 6/2002 | Moriyama | |
| 2002/0125817 A1 | 9/2002 | Yamazaki et al. | |
| 2002/0158835 A1 | 10/2002 | Kobayashi | |
| 2002/0167268 A1* | 11/2002 | Aruga et al. | 313/500 |
| 2003/0020065 A1 | 1/2003 | Honda | |
| 2003/0027369 A1 | 2/2003 | Yamazaki | |
| 2003/0034497 A1 | 2/2003 | Yamazaki et al. | |
| 2003/0107314 A1 | 6/2003 | Urabe | |
| 2003/0111954 A1 | 6/2003 | Koo | |
| 2003/0155573 A1 | 8/2003 | Yamazaki et al. | |
| 2003/0193056 A1 | 10/2003 | Takayama | |
| 2003/0206332 A1 | 11/2003 | Yamazaki et al. | |

FOREIGN PATENT DOCUMENTS

| | | |
|---|---|---|
| CN | 1430287 | 7/2003 |
| JP | 4003933 | 1/1992 |
| JP | 2000182779 | 6/2000 |
| JP | 2001-100654 | 4/2001 |
| JP | 2001-281704 | 10/2001 |
| KR | 1020030049385 | 6/2003 |
| KR | 1020030058911 | 7/2003 |
| WO | 99/12394 | 3/1999 |
| WO | 01/82273 | 11/2001 |

OTHER PUBLICATIONS

Office Action mailed Jul. 2, 2008 from copending U.S. Appl. No. 11/204,042.

* cited by examiner ated on Nov. 15, 2005, and is a continuation-in-part of application Ser. No. 11/204,042, filed on Aug. 16, 2005, which is a continuation of application Ser. No. 10/732,280, filed on Dec. 11, 2003, now issued as U.S. Pat. No. 6,946,791, which claims priority from and the benefit of Korean Patent Application No. 10-2002-0078744, filed on Dec. 11, 2002, which are incorporated by reference for all purposes as if fully set forth herein.

ORGANIC LIGHT-EMITTING DIODE DISPLAY COMPRISING AUXILIARY ELECTRODES

CROSS-REFERENCE TO RELATED APPLICATIONS

This application claims priority from and the benefit of Korean Patent Application No. 10-2005-0109063, filed on Nov. 15, 2005, and is a continuation-in-part of application Ser. No. 11/204,042, filed on Aug. 16, 2005, which is a continuation of application Ser. No. 10/732,280, filed on Dec. 11, 2003, now issued as U.S. Pat. No. 6,946,791, which claims priority from and the benefit of Korean Patent Application No. 10-2002-0078744, filed on Dec. 11, 2002, which are incorporated by reference for all purposes as if fully set forth herein.

BACKGROUND OF THE INVENTION

1. Field of the Invention

The present invention relates to an organic light-emitting diode (OLED) display and a manufacturing method thereof.

2. Discussion of the Background

The recent trend toward lightweight and thin personal computers and television sets requires lightweight and thin display devices. Hence, flat panel displays are replacing conventional cathode ray tubes (CRT). Flat panel displays include a liquid crystal display (LCD), a field emission display (FED), an organic light-emitting diode (OLED) display, and a plasma display panel (PDP). Among flat panel displays, the OLED display is the most promising because of its low power consumption, fast response time, wide viewing angle, and high contrast ratio. An OLED display is a self-emissive display device that includes an organic light-emitting layer interposed between two electrodes. One electrode injects holes and the other injects electrons into the light-emitting layer. The injected electrons and holes combine to form exitons, which emit light as they discharge energy. An OLED display may be a passive matrix display or an active matrix display according to its driving method. The passive matrix OLED display includes a plurality of anode lines, a plurality of cathode lines crossing the anode lines, and a plurality of pixels, each including a light emission layer. Selecting one anode line and one cathode line causes light emission of the pixel located at the intersection of the selected signal lines. The active matrix OLED display includes a plurality of pixels, and each pixel may include a switching transistor, a driving transistor, and a storage capacitor, as well as an anode, a cathode, and a light emission layer. The driving transistor receives a data voltage from the switching transistor and drives a current having a magnitude corresponding to the data voltage. The current from the driving transistor enters the light emission layer to cause light to emit at an intensity that depends on the current.

Here, input terminals of the driving transistors are commonly connected to driving voltage lines, which supply a driving voltage to the respective driving transistors. Hence, the magnitude of the current flowing through each driving transistor may be defined by the driving voltage as well as the data voltage. In other words, the magnitude of the current may be defined by a difference between the driving voltage and the data voltage.

However, with a larger OLED display, the driving voltages applied to the respective driving transistors may not be uniform. Therefore, when data voltages of equal magnitude are applied to the driving transistors, the driving transistors may not output equal driving currents due to voltage drop, etc. Consequently, the same data voltage may result in different gray scales for displaying images.

Accordingly, a difference between driving voltages due to voltage drop may cause cross-talk, which deteriorates image quality.

SUMMARY OF THE INVENTION

The present invention provides a display device that may provide a substantially uniform driving voltage and/or common voltage.

Additional features of the invention will be set forth in the description which follows, and in part will be apparent from the description, or may be learned by practice of the invention.

The present invention discloses an organic light-emitting diode (OLED) display that includes a substrate, an auxiliary electrode disposed on the substrate, a first signal line disposed on the substrate, and a second signal line crossing the first signal line. A driving voltage line is disposed on the substrate, a first thin film transistor is connected to the first signal line and the second signal line, and a second thin film transistor is connected to the first thin film transistor and the driving voltage line. A first electrode is connected to the second thin film transistor, a second electrode faces the first electrode, and a light-emitting member is disposed between the first electrode and the second electrode. The auxiliary electrode is connected to at least one of the driving voltage line and the second electrode.

The present invention also discloses an OLED display that includes a substrate, a first auxiliary electrode disposed on the substrate, a first signal line disposed on the substrate, and a second signal line crossing the first signal line. A driving voltage line is connected to the first auxiliary electrode, a first thin film transistor is connected to the first signal line and the second signal line, and a second thin film transistor is connected to the first thin film transistor and the driving voltage line. A first electrode is connected to the second thin film transistor, a second electrode faces the first electrode, and a light-emitting member is disposed between the first electrode and the second electrode.

The present invention also discloses an OLED display, that includes a substrate, an auxiliary electrode disposed on the substrate, a first signal line disposed on the substrate, and a second signal line crossing the first signal line. A first thin film transistor is connected to the first signal line and the second signal line, and a second thin film transistor is connected to the first thin film transistor. A first electrode is connected to the second thin film transistor, a second electrode faces the first electrode and is connected to the auxiliary electrode, and a light-emitting member is disposed between the first electrode and the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
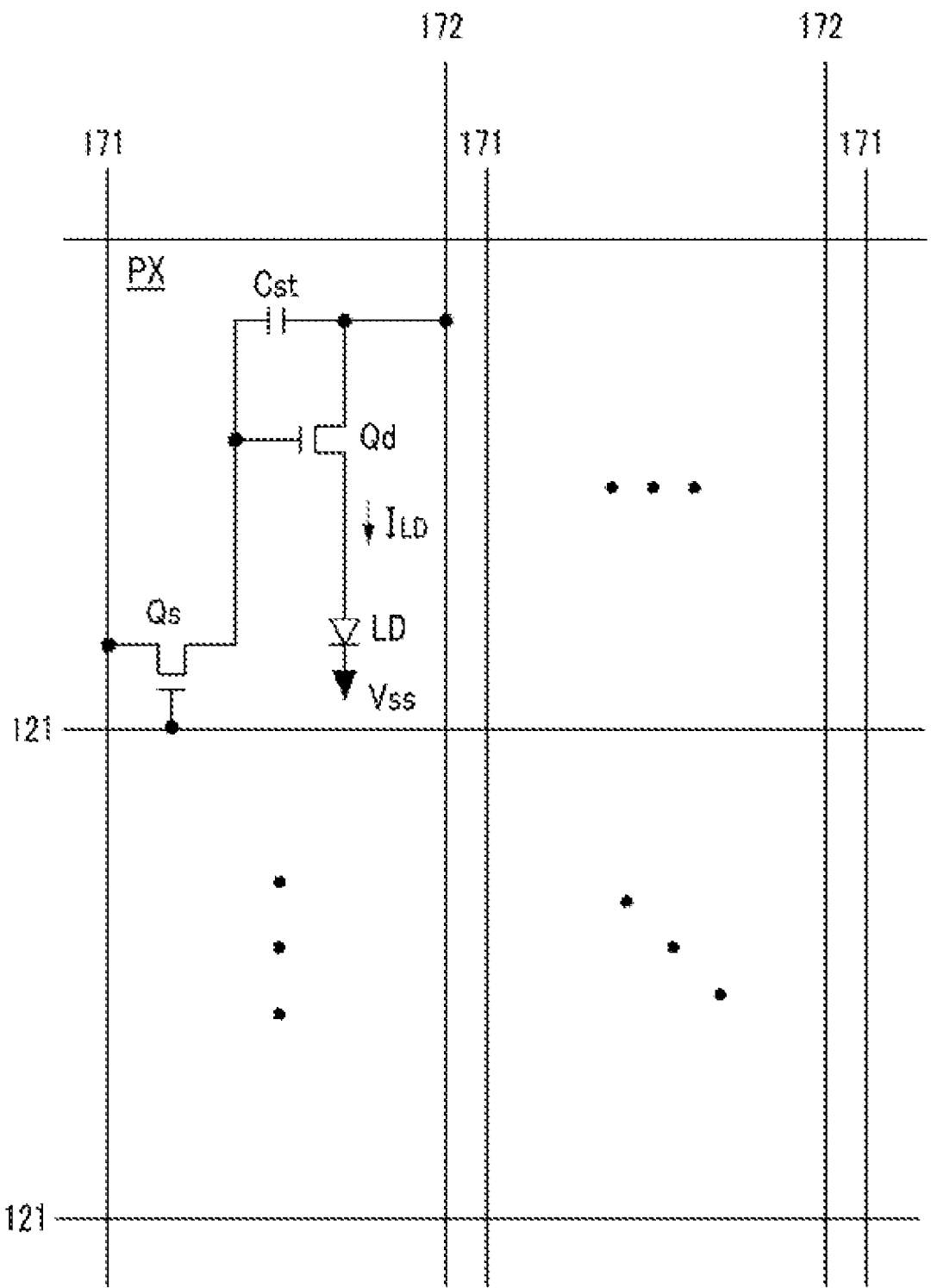
FIG. 1 is an equivalent circuit diagram of an OLED display according to exemplary embodiments of the present invention.

The present invention will now be described more fully hereinafter with reference to the accompanying drawings, in which exemplary embodiments of the invention are shown. As those skilled in the art would realize, the described embodiments may be modified in various ways, all without departing from the spirit or scope of the invention. Therefore, this invention should not be construed as limited to the embodiments set forth herein. Rather, these embodiments are provided so that this disclosure is thorough, and will fully convey the scope of the invention to those skilled in the art.

In the drawings, the size and relative sizes of layers, films, panels, regions, etc., may be exaggerated for clarity. Like reference numerals designate like elements throughout the specification. It will be understood that when an element such as a layer, film, region, or substrate is referred to as being "on" or "connected to" another element, it can be directly on or directly connected to the other element or intervening elements may also be present. In contrast, when an element is referred to as being "directly on" or "directly connected to" another element, there are no intervening elements present.

FIG. 1 is an equivalent circuit diagram of an OLED display according to exemplary embodiments of the present invention.

Referring to FIG. 1, the OLED display includes a plurality of signal lines 121, 171, and 172. A plurality of pixels PX are connected to the signal lines 121, 171, and 172 and arranged substantially in a matrix.

The signal lines include a plurality of gate lines 121, which transmit gate signals (or scanning signals), a plurality of data lines 171, which transmit data signals, and a plurality of driving voltage lines 172, which transmit a driving voltage. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a capacitor Cst, and an OLED LD.

The switching transistor Qs has a control terminal connected to a gate line 121, an input terminal connected to a data line 171, and an output terminal connected to the driving transistor Qd. The switching transistor Qs transmits the data signals applied to the data line 171 to the driving transistor Qd in response to the gate signal applied to the gate line 121.

The capacitor Cst is connected between the control terminal and the input terminal of the driving transistor Qd. The capacitor Cst stores the data signal applied to the control terminal of the driving transistor Qd and maintains the data signal after the switching transistor Qs turns off.

The OLED LD has an anode connected to the output terminal of the driving transistor Qd and a cathode connected to a common voltage Vss. The OLED LD emits light having an intensity depending on an output current $I_{LD}$ of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. Additionally, the connections among the transistors Qs and Qd, the capacitor Cst, and the OLED LD may be modified.

A detailed structure of the OLED display of FIG. 1 according to an exemplary embodiment of the present invention will be described in detail below with reference to FIG. 2, FIG. 3, and FIG. 4.

Figure 2:
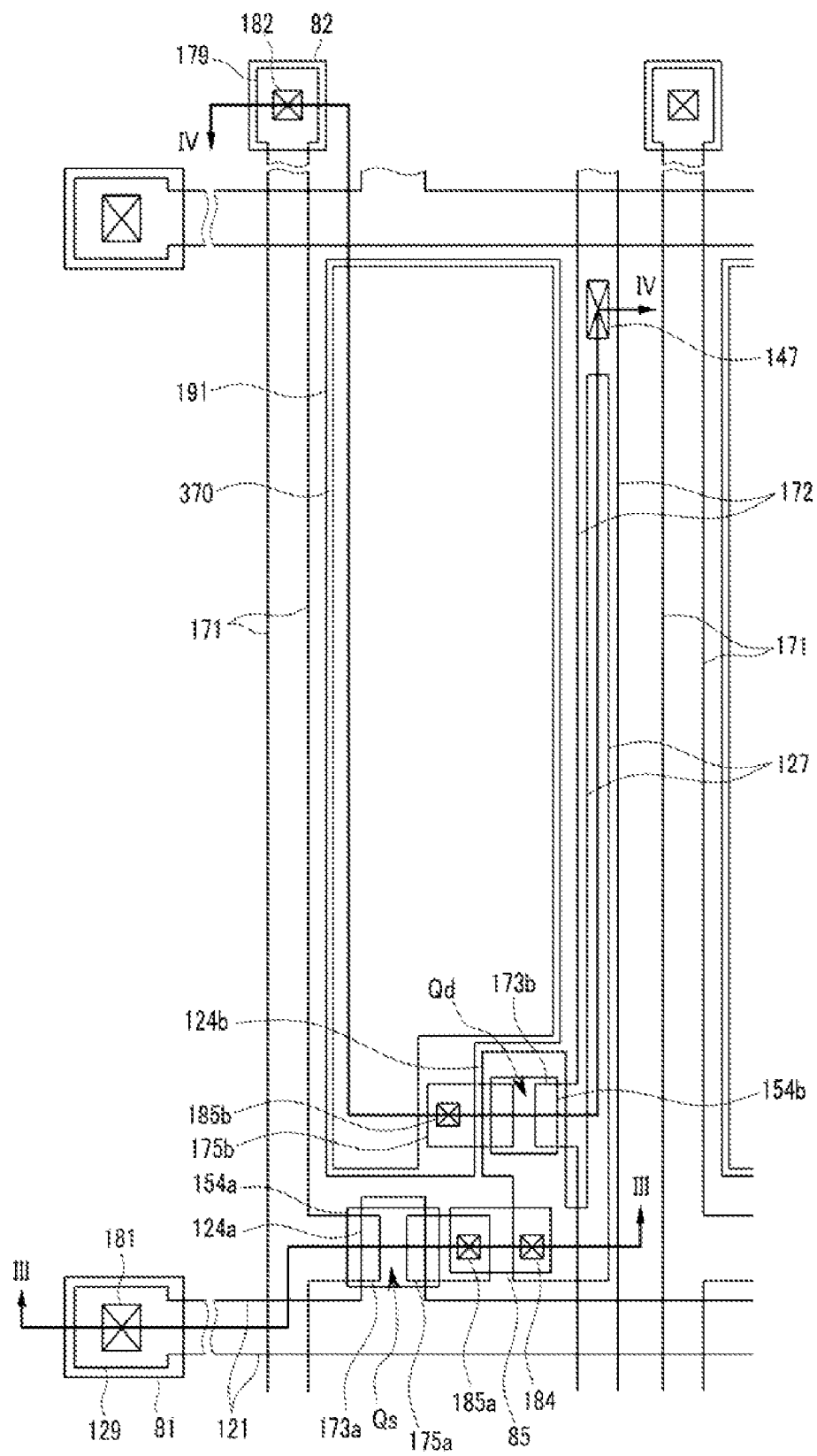
FIG. 2 is a layout view of an OLED display according to a first exemplary embodiment of the present invention.
Figure 3:
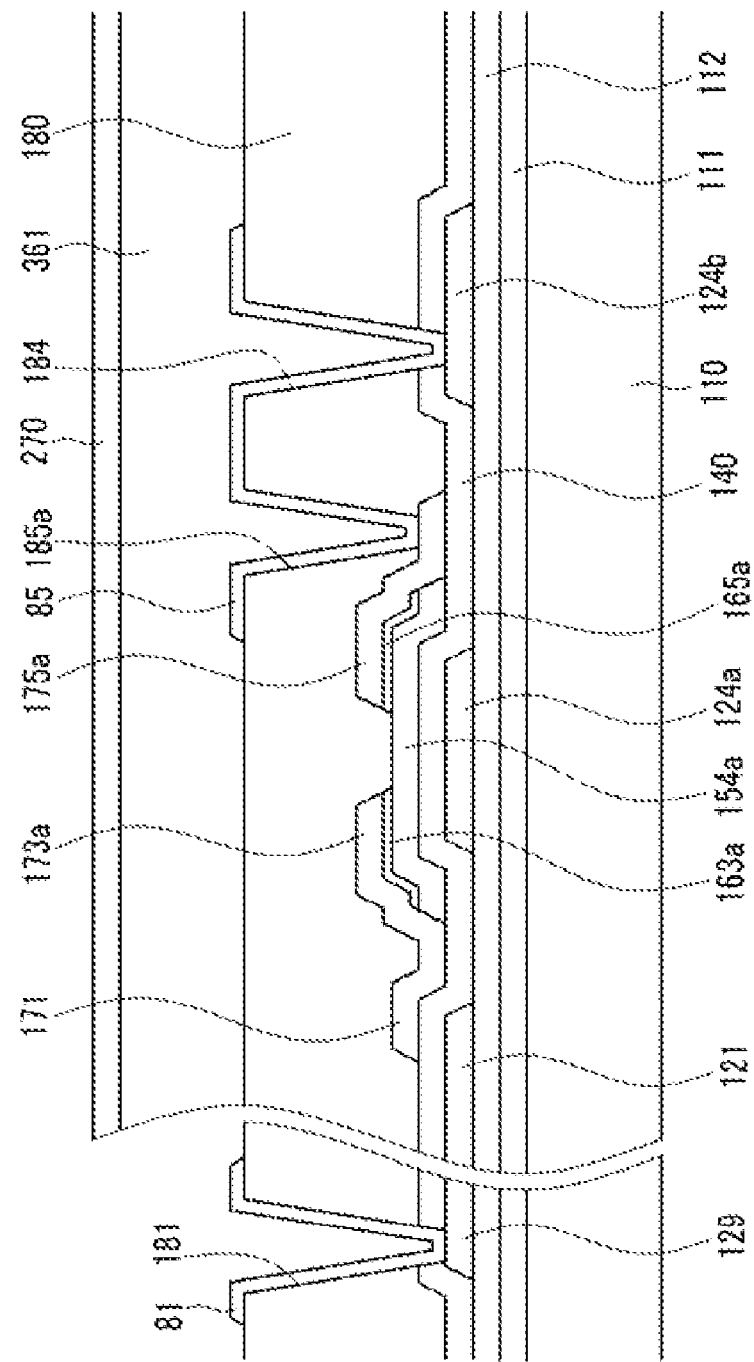
FIG. 3 and FIG. 4 are sectional views of the OLED display of FIG. 2 taken along lines III-III and IV-IV, respectively.
Figure 4:
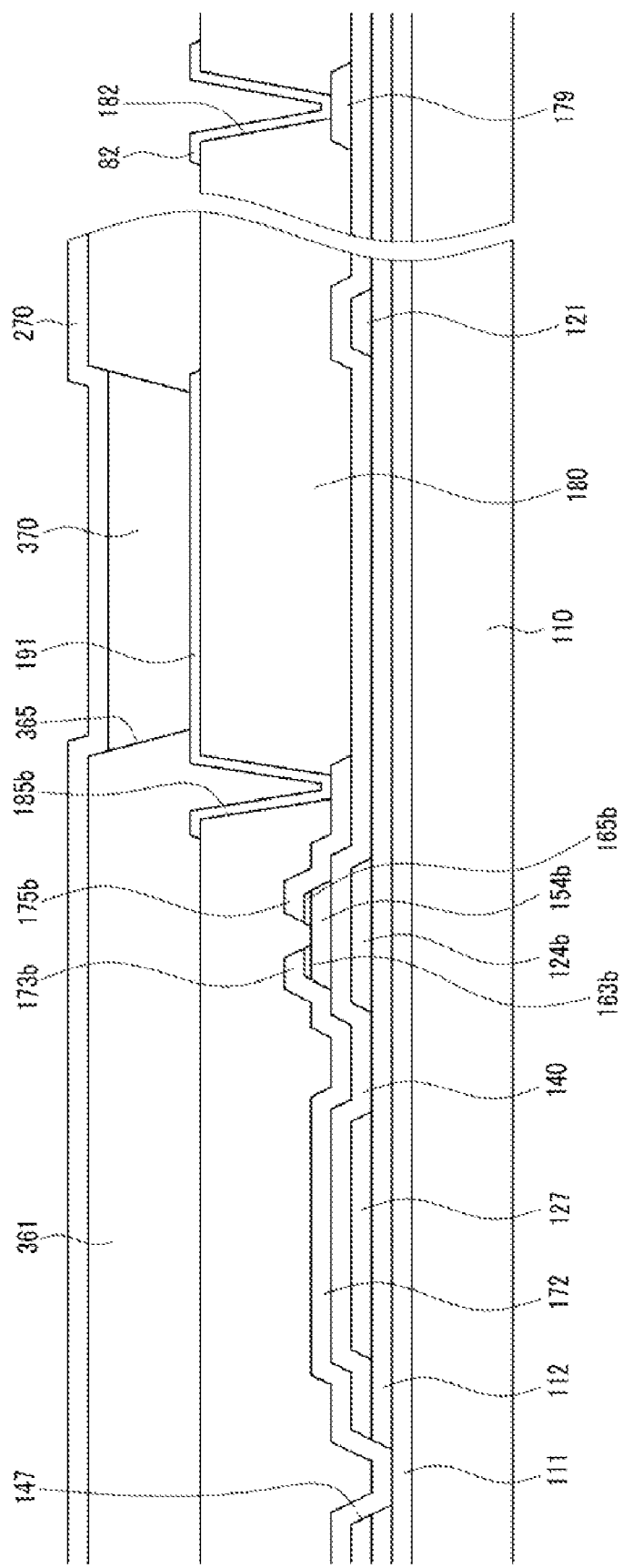

FIG. 2 is a layout view of an OLED display according to a first embodiment of the present invention, and FIG. 3 and FIG. 4 are sectional views of the OLED display of FIG. 2 taken along lines III-III and IV-IV, respectively.

An auxiliary electrode 111 is formed on an insulating substrate 110, which may be made of a material such as transparent glass or plastic. The auxiliary electrode 111 may have a substantially planar shape, and it may cover the entire a mother substrate (not shown). When the OLED display is a bottom emission type, the auxiliary electrode 111 may be made of a transparent or translucent conductor such as indium tin oxide (ITO) or indium zinc oxide (IZO), etc. Alternatively, when the OLED display is a top-emission type, the auxiliary electrode 111 may be made of a low resistivity conductor including Al, Ag, Cu, or alloys thereof.

A blocking layer 112, which may be made of silicon nitride (SiNx) or silicon oxide (SiOx), etc., is formed on the auxiliary electrode 111.

A plurality of gate conductors that include a plurality of gate lines 121 and a plurality of second control electrodes 124b are formed on the blocking layer 112. The gate lines 121 include first control electrodes 124a.

The gate lines 121 transmit gate signals and extend substantially in a transverse direction. Each gate line 121 further includes an end portion 129, which has a large area for connecting to another layer or an external driving circuit, and the first control electrodes 124a, which project upward from the gate line 121. The gate lines 121 may extend to be directly connected to a gate driving circuit (not shown) for generating the gate signals, which may be integrated on the substrate 110.

Each second control electrode 124b is spaced apart from the gate lines 121 and includes a storage electrode 127, which extends downward from the second control electrode 124b, turns to the right, and extends upward as shown in FIG. 2.

The gate conductors 121 and 124b may be made of Al, Ag, Cu, Mo or an alloy thereof, Cr, Ta, Ti, etc. The gate conductors 121 and 124b may have a multi-layered structure including two films having different physical characteristics from each other.

The lateral sides of the gate conductors 121 and 124b are inclined at an angle ranging from about 30 to 80 degrees relative to a surface of the substrate 110.

A gate insulating layer 140, which may be made of silicon nitride (SiNx) or silicon oxide (SiOx), is formed on the gate conductors 121 and 124b. The gate insulating layer 140 and the blocking layer 112 have a plurality of contact holes 147 exposing portions of the auxiliary electrode 111.

A plurality of first and second semiconductor islands 154a and 154b, which may be made of hydrogenated amorphous silicon ("a-Si") or polysilicon, are formed on the gate insulating layer 140. The first and second semiconductor islands 154a and 154b are disposed on the first and second control electrodes 124a and 124b, respectively.

A plurality of pairs of first ohmic contact islands 163a and 165a and a plurality of pairs of second ohmic contact islands 163b and 165b are formed on the first and the second semiconductor islands 154a and 154b, respectively. The ohmic contacts 163a, 163b, 165a, and 165b may be made of silicide or n+ hydrogenated a-Si heavily doped with an n-type impurity such as phosphorous.

A plurality of data conductors, which include a plurality of data lines 171, a plurality of driving voltage lines 172, and a plurality of first and second output electrodes 175a and 175b, are formed on the ohmic contacts 163a, 163b, 165a, and 165b and the gate insulating layer 140.

The data lines 171, which transmit data signals, extend substantially in the longitudinal direction and cross the gate lines 121. Each data line 171 includes a plurality of first input electrodes 173a extending toward the first control electrodes 124a and an end portion 179, which has a large area for connecting to another layer or an external driving circuit. The data lines 171 may extend to be directly connected to a data driving circuit (not shown) for generating the data signals, and the data driving circuit may be integrated on the substrate 1110.

The driving voltage lines 172, which transmit driving voltages, extend substantially in the longitudinal direction and cross the gate lines 121. Each driving voltage line 172 includes a plurality of second input electrodes 173b extending toward the second control electrodes 124b. The driving voltage lines 172 overlap the storage electrodes 127.

The driving voltage lines 172 are connected to the auxiliary electrode 111 through the contact holes 147. The driving voltage lines 172 and the auxiliary electrode 111 are supplied with the same voltage. Consequently, driving voltages applied to the pixels may be substantially equal to each other. Moreover, although the auxiliary electrode 111 has sheet resistance, and a voltage applied to the auxiliary electrode 111 drops due to surface resistance, voltages applied to the respective pixels may be almost uniformly maintained. Therefore, substantially uniform voltages may be applied to the pixels such that image deterioration, such as a cross-talk due to a luminance difference of pixels, largely decreases.

The first and second output electrodes 175a and 175b are spaced apart from each other and from the data lines 171 and the driving voltage lines 172. Each pair of a first input electrode 173a and a first output electrode 175a are disposed opposing each other with respect to a first control electrode 124a, and each pair of a second input electrode 173b and a second output electrode 175b are disposed opposing each other with respect to a second control electrode 124b.

The data conductors 171, 172, 175a, and 175b may be made of a refractory metal including Mo, Cr, Ta, Ti, or alloys thereof. They may have a multi-layered structure including a refractory metal film and a low resistivity film.

Similar to the gate conductors 121 and 124b, lateral sides of the data conductors 171, 172, 175a, and 175b are inclined at an angle ranging from about 30 to 80 degrees relative to a surface of the substrate 110.

A passivation layer 180 is formed on the data conductors 171, 172, 175a, and 175b, the exposed portions of the semiconductor islands 154a and 154b, and the gate insulating layer 140.

The passivation layer 180 may be made of an inorganic or organic insulator, and it may have a substantially flat top-surface. Examples of the inorganic insulator include silicon nitride and silicon oxide, and an example of the organic insulator includes a polyacryl. The passivation layer may include two or more layers. For example, the passivation layer 180 may have a double-layered structure including a lower film of an inorganic insulator and an upper film of an organic insulator.

The passivation layer 180 has a plurality of contact holes 182, 185a, and 185b exposing the end portions 179 of the data lines 171, the first output electrodes 175a, and the second output electrodes 175b, respectively, and the passivation layer 180 and the gate insulating layer 140 have a plurality of contact holes 181 and 184 exposing the end portions 129 of the gate lines 121 and the second control electrodes 124b, respectively.

A plurality of pixel electrodes 191, a plurality of connecting members 85, and a plurality of contact assistants 81 and 82 are formed on the passivation layer 180.

The pixel electrodes 191 are connected to the second output electrodes 175b through the contact holes 185b.

The connecting members 85 are connected to the second control electrodes 124b and the first output electrodes 175a through the contact holes 184 and 185a, respectively.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance adhesion between the end portions 129 and 179 and external devices.

A partition 361 is formed on the passivation layer 180 to form a bank around the pixel electrodes 191, thereby defining openings 365. The partition 361 may be made of an organic material having thermal resistance and solvent resistance such as acrylic resin or polyimide resin, etc., or an inorganic insulating material such as $SiO_2$ or $TiO_2$, etc. The partition 361 may be made of a photosensitive material containing a black pigment so that the black partition 361 may serve as a light blocking member and it may be more easily formed.

A plurality of organic light-emitting members 370 are formed on the pixel electrodes 191. The organic light-emitting members 370 may be confined in the openings 365 defined by the partition 361.

Each organic light-emitting member 370 may have a multi-layered structure including a light emitting layer (not shown), which emits light, and one or more auxiliary layers (not shown), which improve the light-emitting layer's light emission efficiency.

The light-emitting layers may be made of an organic material or a mixture of an organic material and an inorganic material that emits light of one primary color such as red, green, or blue, or the light-emitting layers may include a compound doped with a polyfluorene derivative, a (poly) paraphenylenevinylene derivative, a polyphenylene derivative, a polyfluorene derivative, polyvinylcarbazole, a polythiophene derivative, or a compound made by adding a perylene-containing pigment, a cumarine-containing pigment, a rhodamine group pigment, rubrene, perylene, 9,10-diphenylanthracene, tetraphenylbutadiene, Nile red, coumarin, quinacridone, etc., to a high polymer of the derivatives. The OLED display displays images by spatially adding the monochromatic primary color lights emitted from the light-emitting layers.

The auxiliary layers (not shown) may include an electron transport layer (ETL) and a hole transport layer (HTL) to improve the balance of electrons and holes, and an electron injecting layer (EIL) and a hole injecting layer (HIL) to improve the injection of electrons and holes. The auxiliary layers may include one or more of such layers. The HTL and the HIL may be made of a material having a work function having a magnitude that is between that of the pixel electrode 191 and the light-emitting layer, and the ETL and the EIL may be made of a material having a work function that is between that of a common electrode 270 and the light-emitting layers. For instance, the HTL and the HIL may include poly-(3,4-ethylenedioxythiophene:polystyrenesulfonate (PEDOT: PSS), etc.

The common electrode 270 is formed on the organic light-emitting members 370 and the partition 361. The common electrode 270 is formed on the entire surface of the organic light-emitting members 370, and it applies a current to the organic light-emitting member 370 together with the pixel electrodes 191.

In an OLED display such as described above, a first control electrode 124a connected to a gate line 121, a first input electrode 173a connected to a data line 171, and a first output electrode 175a, along with a first semiconductor island 154a, form a switching TFT Qs having a channel formed in the first semiconductor island 154a disposed between the first input electrode 173a and the first output electrode 175a. Likewise, a second control electrode 124b connected to a first output electrode 175a, a second input electrode 173b connected to a driving voltage line 172, and a second output electrode 175b connected to a pixel electrode 191, along with a second semiconductor island 154b, form a driving TFT Qd having a channel formed in the second semiconductor island 154b disposed between the second input electrode 173b and the second output electrode 175b.

In the exemplary embodiment of FIG. 1 and FIG. 2, each pixel includes a switching TFT Qs and a driving TFT Qd, but the pixels may further include at least one transistor and a plurality of wires for driving the transistor such that deterioration of the organic light-emitting diode LD and the driving TFT Qd due to long-time driving is prevented or compensated, to prevent shortening the life of the OLED.

A pixel electrode 191, an organic light-emitting member 370, and the common electrode 270 form an OLED LD having the pixel electrode 191 as an anode and the common electrode 270 as a cathode, or vice versa. The overlapping portions of a storage electrode 127 and a driving voltage line 172 form a storage capacitor Cst.

Alternatively, the semiconductor islands 154a and 154b may be made of polysilicon. In this case, they may include intrinsic regions (not shown) disposed under the gate electrodes 124a and 124b and extrinsic regions (not shown) disposed opposing each other with respect to the intrinsic regions. The extrinsic regions are connected to the input electrodes 173a and 173b and the output electrodes 175a and 175b, and the ohmic contacts 163a, 163b, 165a, and 165b may be omitted.

Further, the gate electrodes 124a and 124b may be disposed over the semiconductor islands 154a and 154b, while the gate insulating layer 140 is still interposed between the semiconductor islands 154a and 154b and the gate electrodes 124a and 124b. Here, the data conductors 171, 172, 173b and 175b may be disposed on the gate insulating layer 140 and connected to the semiconductor islands 154a and 154b through contact holes (not shown) in the gate insulating layer 140. Otherwise, the data conductors 171, 172, 173b, and 175b may be disposed under the semiconductor islands 154a and 154b and may contact the semiconductor islands 154a and 154b.

A method of manufacturing the OLED display shown in FIGS. 2-4 is described below with reference to FIGS. 5-16, as well as FIGS. 2-4, according to an exemplary embodiment of the present invention.

FIG. 5, FIG. 8, FIG. 11, and FIG. 14 are layout views of the OLED display of FIG. 2, FIG. 3, and FIG. 4 in intermediate steps of a manufacturing method thereof according to an exemplary embodiment of the present invention. FIG. 6 and FIG. 7 are sectional views taken along lines VI-VI and VII-VII of FIG. 5, respectively. FIG. 9 and FIG. 10 are sectional views taken along lines IX-IX and X-X of FIG. 8, respectively. FIG. 12 and FIG. 13 are sectional views taken along lines XII-XII and XIII-XIII of FIG. 11, respectively. FIG. 15 and FIG. 16 are sectional views taken along lines XV-XV and XVI-XVI of FIG. 14, respectively.

Figure 5:
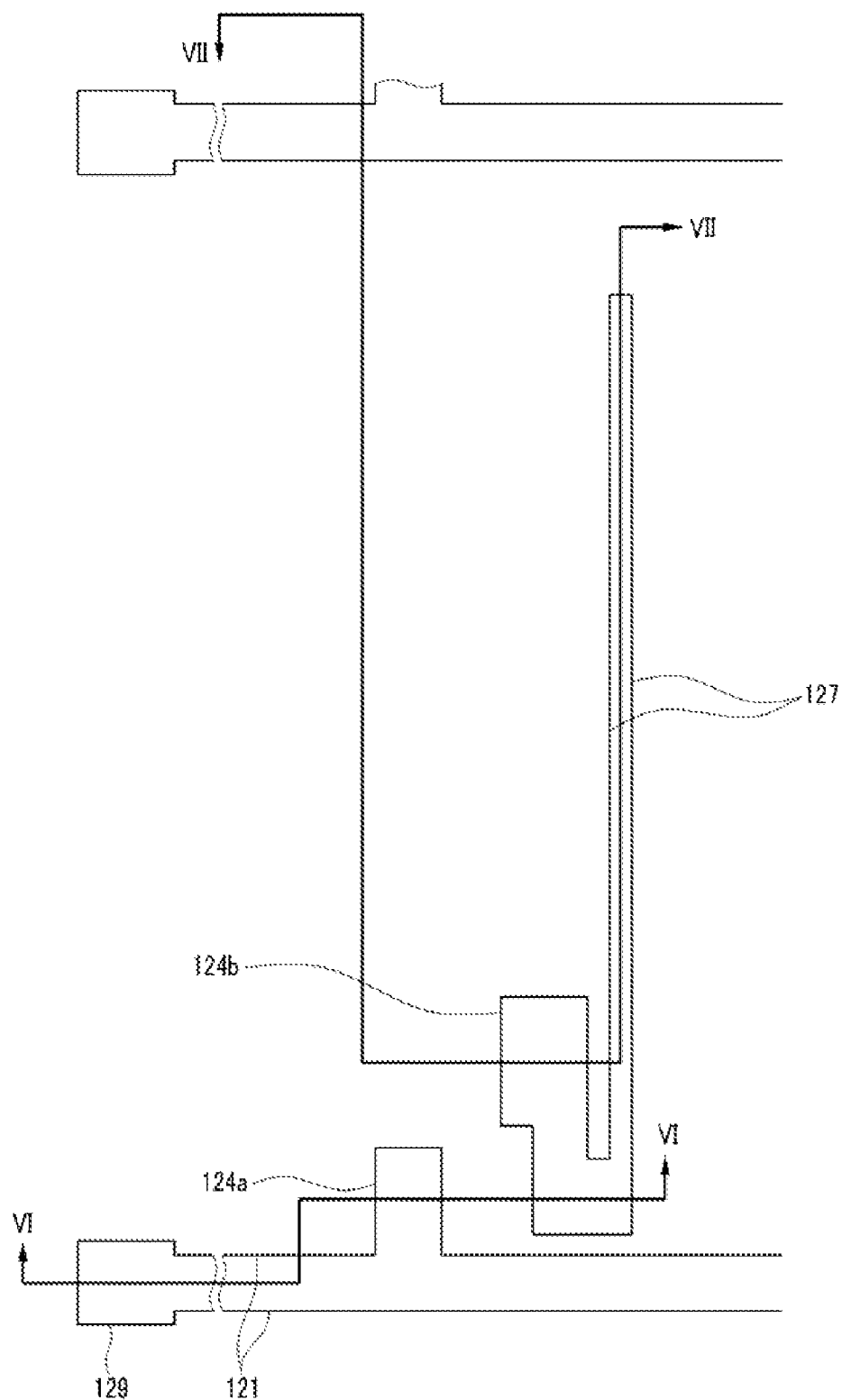
FIG. 5, FIG. 8, FIG. 11, and FIG. 14 are layout views of the OLED display of FIG. 2, FIG. 3, and FIG. 4 showing intermediate steps of a manufacturing method thereof according to a first exemplary embodiment of the present invention.
Figure 6:
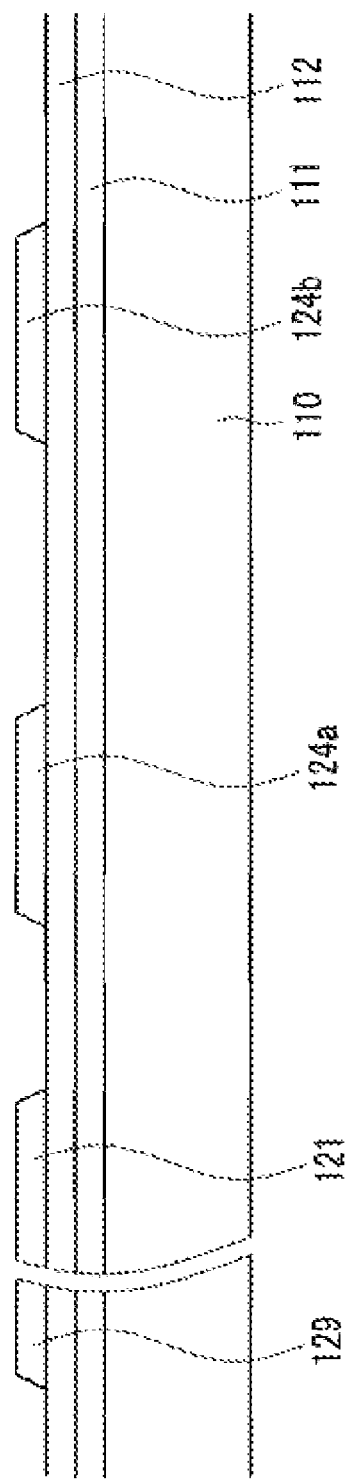
FIG. 6 and FIG. 7 are sectional views of the OLED display of FIG. 5 taken along lines VI-VI and VII-VII, respectively.
Figure 7:
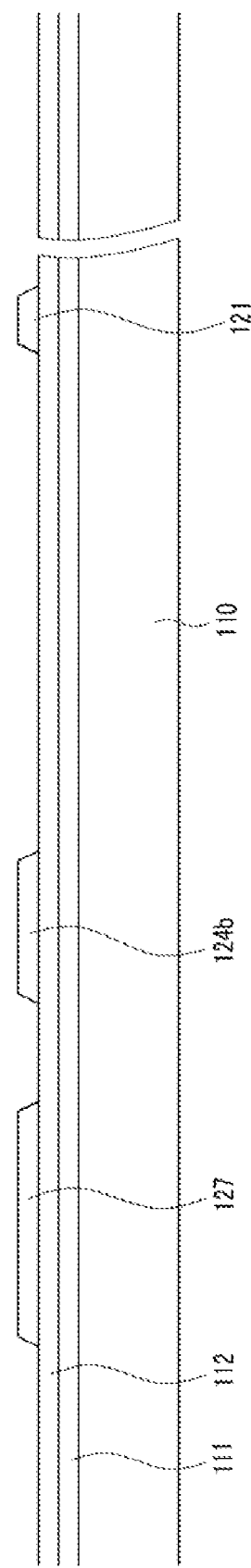

Referring to FIG. 5, FIG. 6, and FIG. 7, an auxiliary electrode 111, which may be made of a conductor such as ITO, IZO, etc., is formed on a substrate 110. For example, the auxiliary electrode 111 may be formed by disposing a shadow mask on the substrate 110 and depositing the conductor. Alternatively, the conductor may be deposited on the entire surface of the substrate 110 and portions of the conductor on ends of the substrate 110 may be removed.

Next, a blocking layer 112, which may be made of silicon nitride, is formed on the auxiliary electrode 111.

Gate conductors that include a plurality of gate lines 121 and a plurality of second control electrodes 124b are formed on the blocking layer 112. The gate lines 121 include first control electrodes 124a and end portions 129, and the second control electrodes 124b include storage electrodes 127. The gate conductors are preferably made of an Al alloy.

Figure 8:
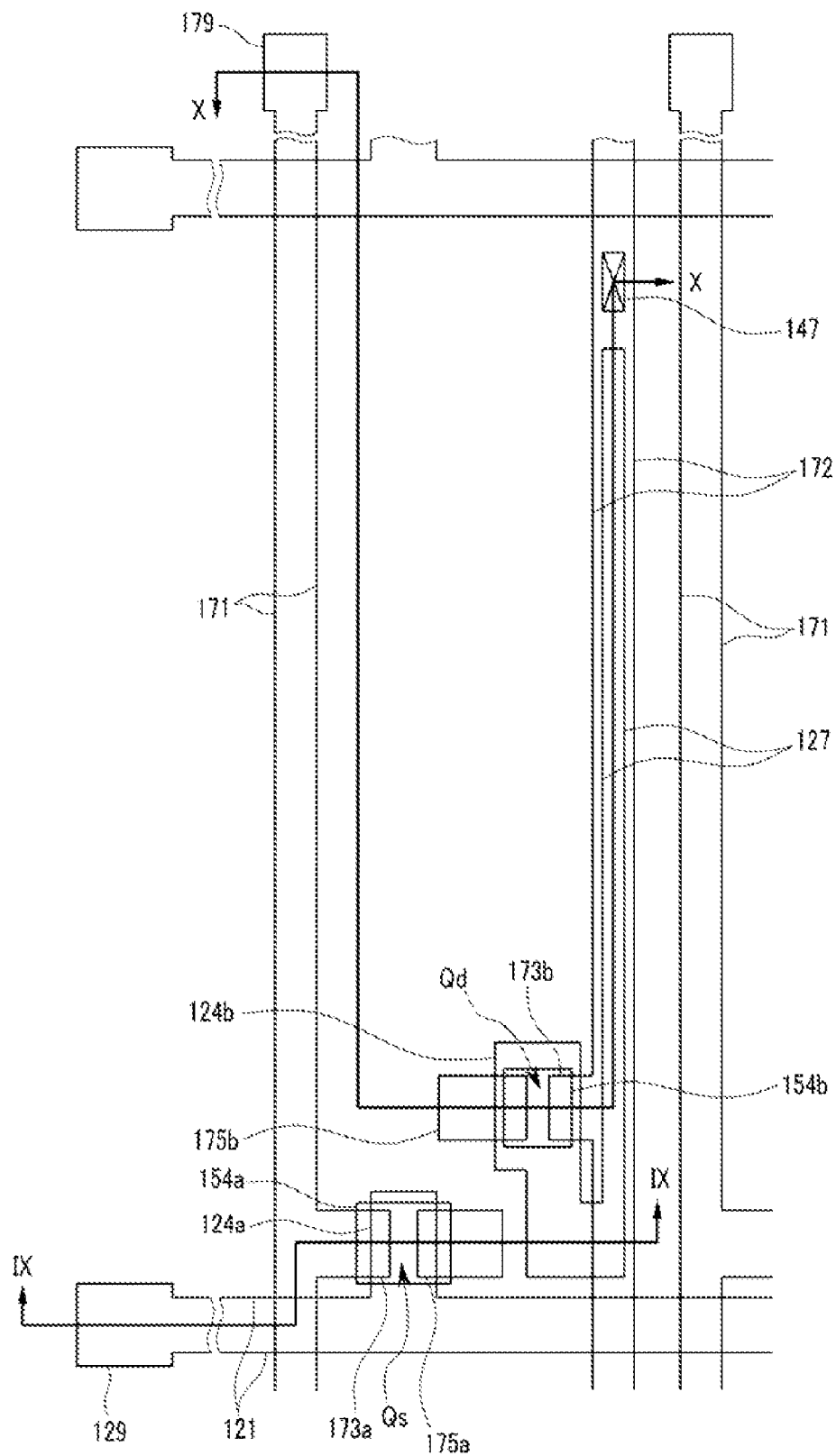
Figure 9:
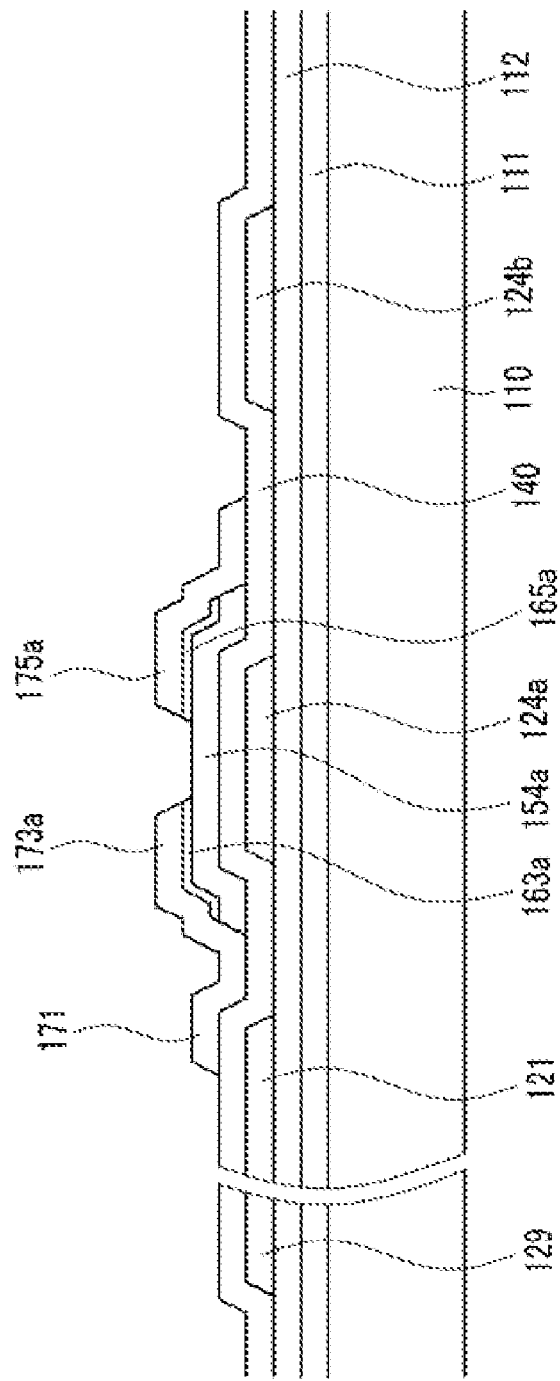
FIG. 9 and FIG. 10 are sectional views of the OLED display of FIG. 8 taken along lines IX-IX and X-X, respectively.
Figure 10:
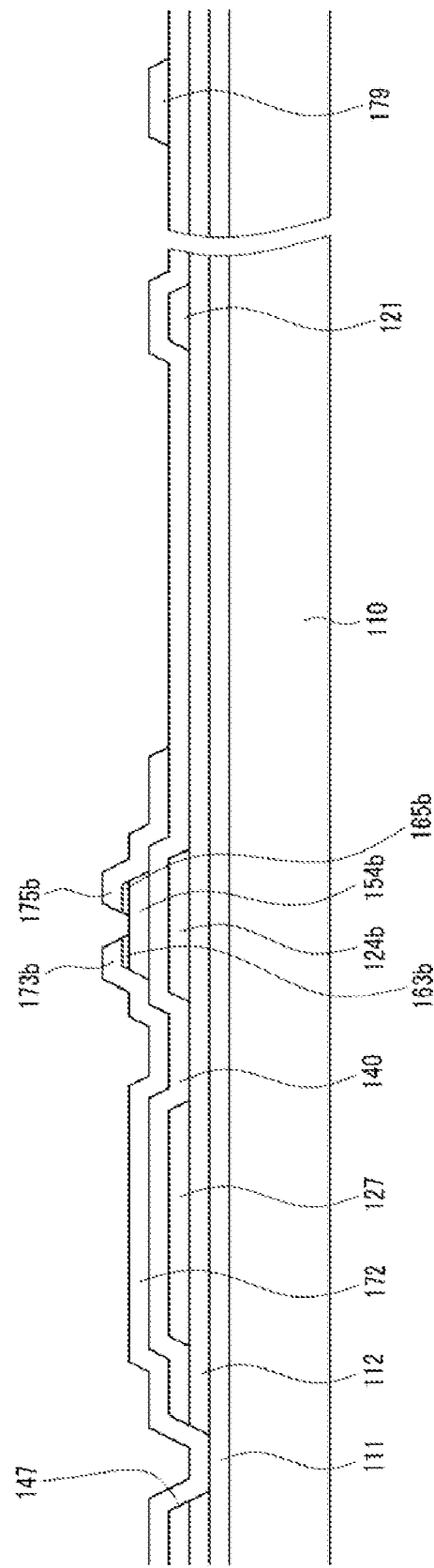

Referring to FIG. 8, FIG. 9, and FIG. 10, after sequentially depositing a gate insulating layer 140, an intrinsic a-Si layer, and an extrinsic a-Si layer on the gate insulating layer 140, the extrinsic a-Si layer and the intrinsic a-Si layer are patterned by photolithography and etched to form a plurality of extrinsic semiconductor islands (not shown) and a plurality of intrinsic semiconductor islands 154a and 154b.

The gate insulating layer 140 and the blocking layer 112 may be patterned by photolithography to form a plurality of contact holes 147.

Data conductors that include a plurality of data lines 171, a plurality of driving voltage lines 172, and a plurality of first and second output electrodes 175a and 175b are preferably made of an Al alloy. The data lines 171 include first input electrodes 173a and end portions 179, and the driving voltage lines 172 include second input electrodes 173b. Here, the driving voltage lines 172 are connected to the auxiliary electrode 111 through the contact holes 147.

Thereafter, portions of the extrinsic semiconductor islands, which are not covered with the data conductors 171, 172, 175a, and 175b, may be removed by etching to complete a plurality of ohmic contact islands 163a, 163b, 165a, and 165b and to expose portions of the intrinsic semiconductor islands 154a and 154b.

Figure 11:
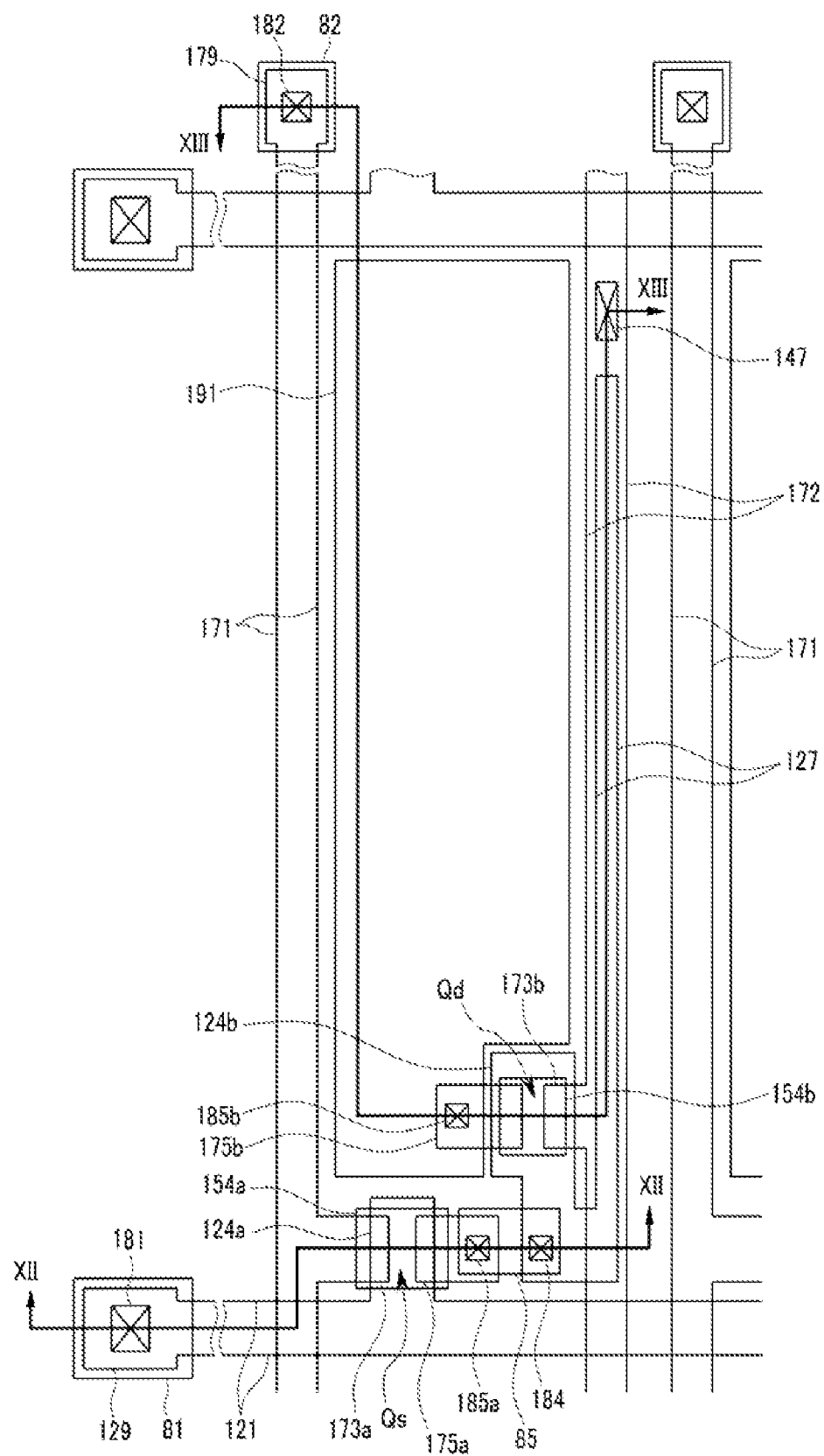
Figure 12:
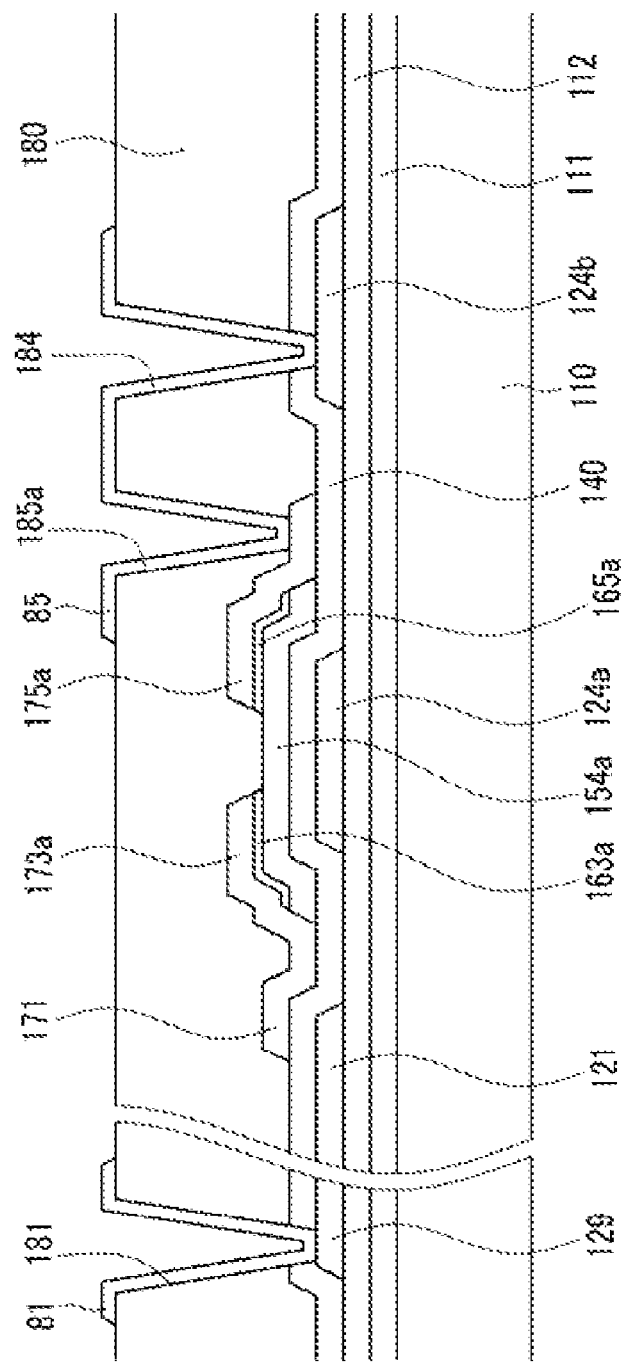
FIG. 12 and FIG. 13 are sectional views of the OLED display of FIG. 1 taken along lines XII-XII and XIII-XIII, respectively.
Figure 13:
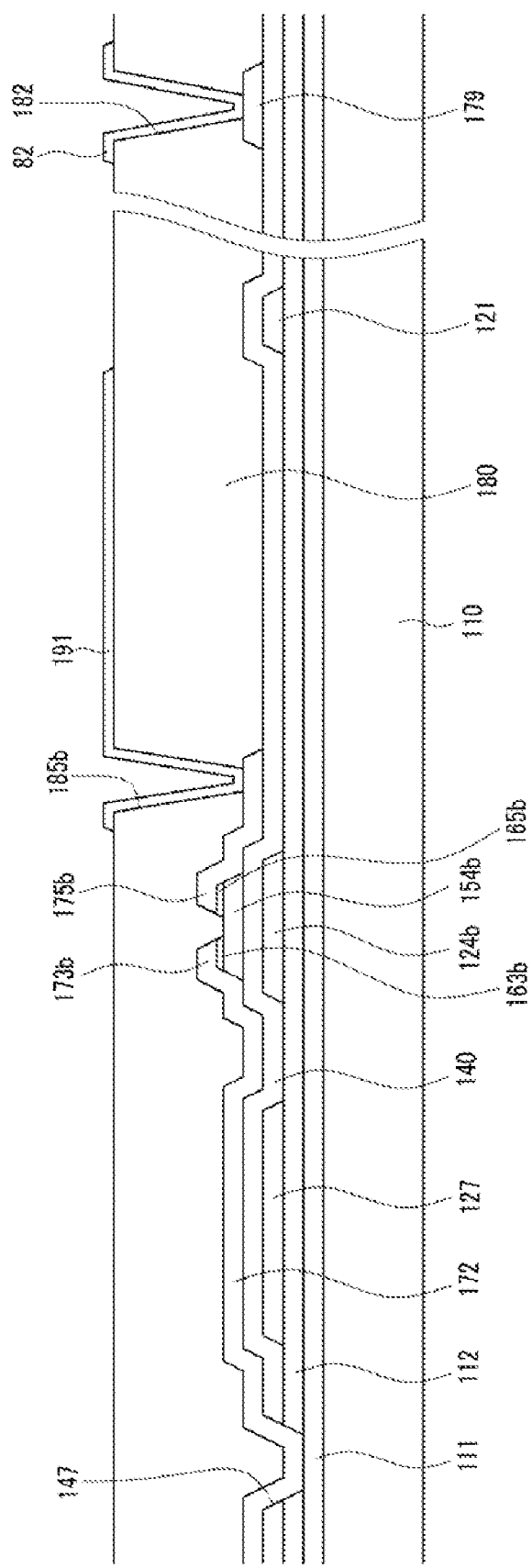

Referring to FIG. 11, FIG. 12, and FIG. 13, a passivation layer 180 is deposited and patterned by photolithography and etching using chemical vapor deposition or a printing process to form a plurality of contact holes 181, 182, 184, 185a and 185b. The contact holes 181, 182, 184, 185a, and 185b expose the end portions 129 of the gate lines 121, the end portions 179 of the data lines 171, the second control electrodes 124b, the first output electrodes 175a, and the second output electrodes 175b, respectively.

Next, referring FIG. 11, FIG. 12, and FIG. 13, a plurality of pixel electrodes 191, a plurality of connecting members 85, and a plurality of contact assistants 81 and 82 are formed on the passivation layer 180.

Figure 14:
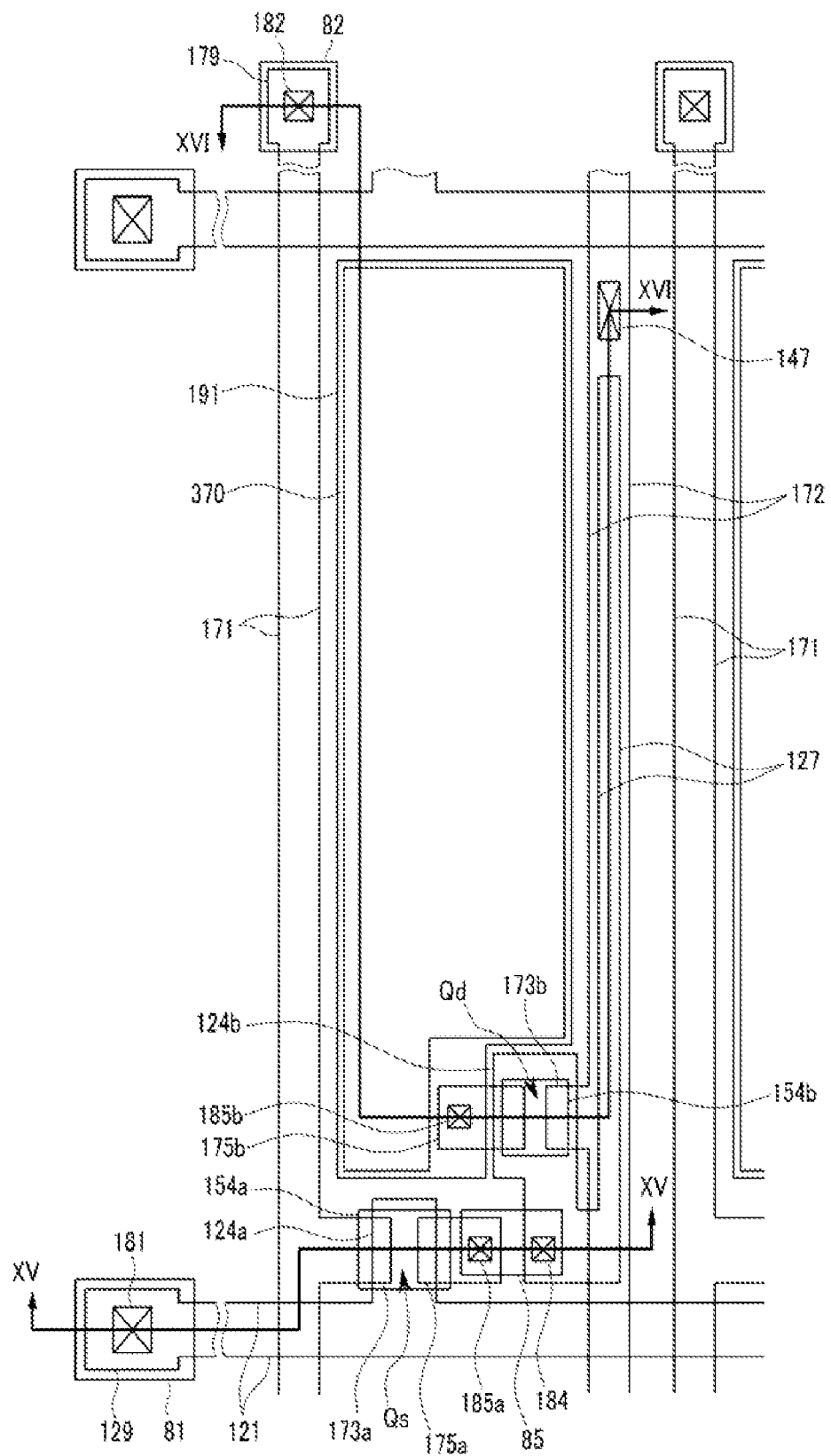
Figure 15:
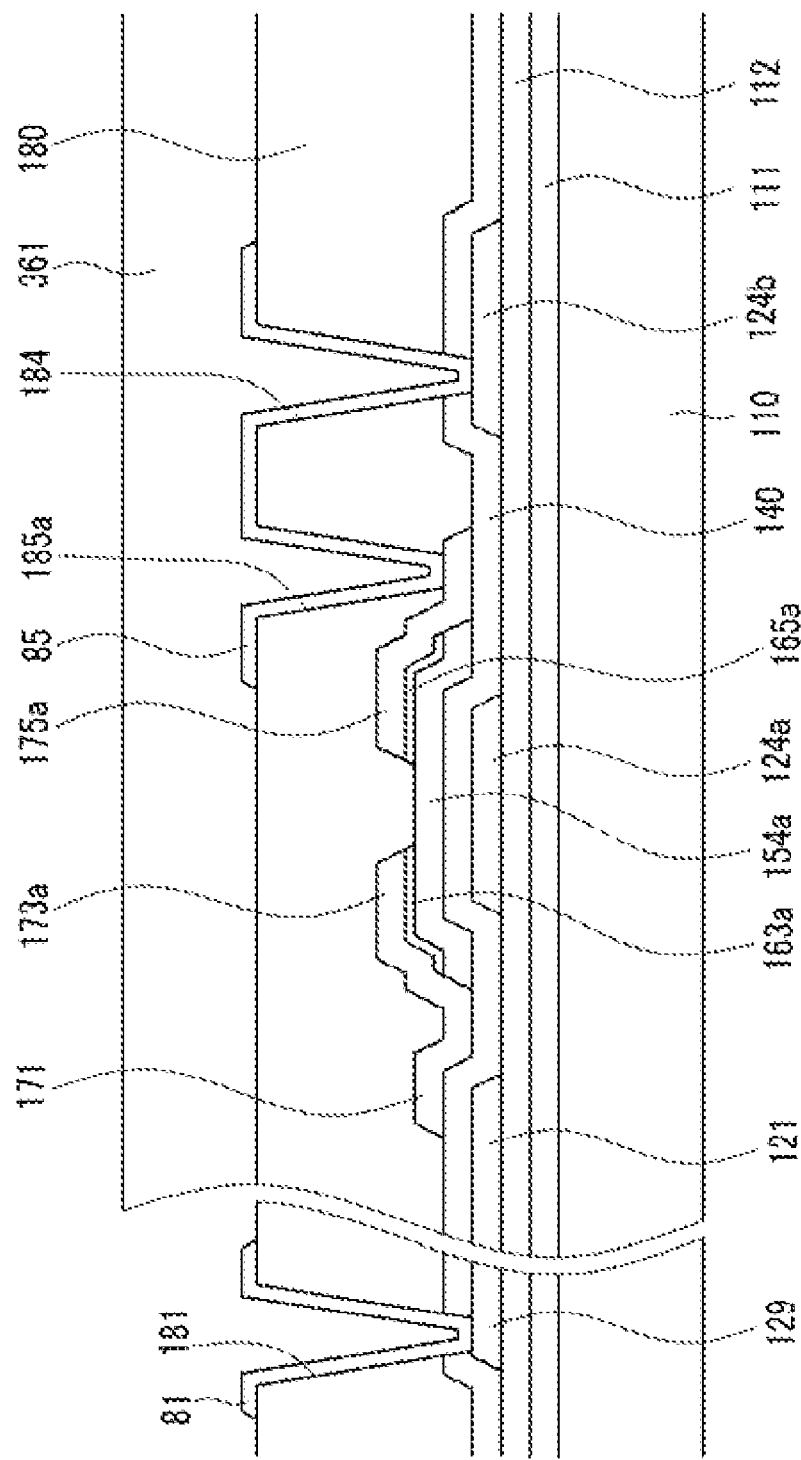
FIG. 15 and FIG. 16 are sectional views of the OLED display of FIG. 14 taken along lines XV-XV and XVI-XVI, respectively.
Figure 16:
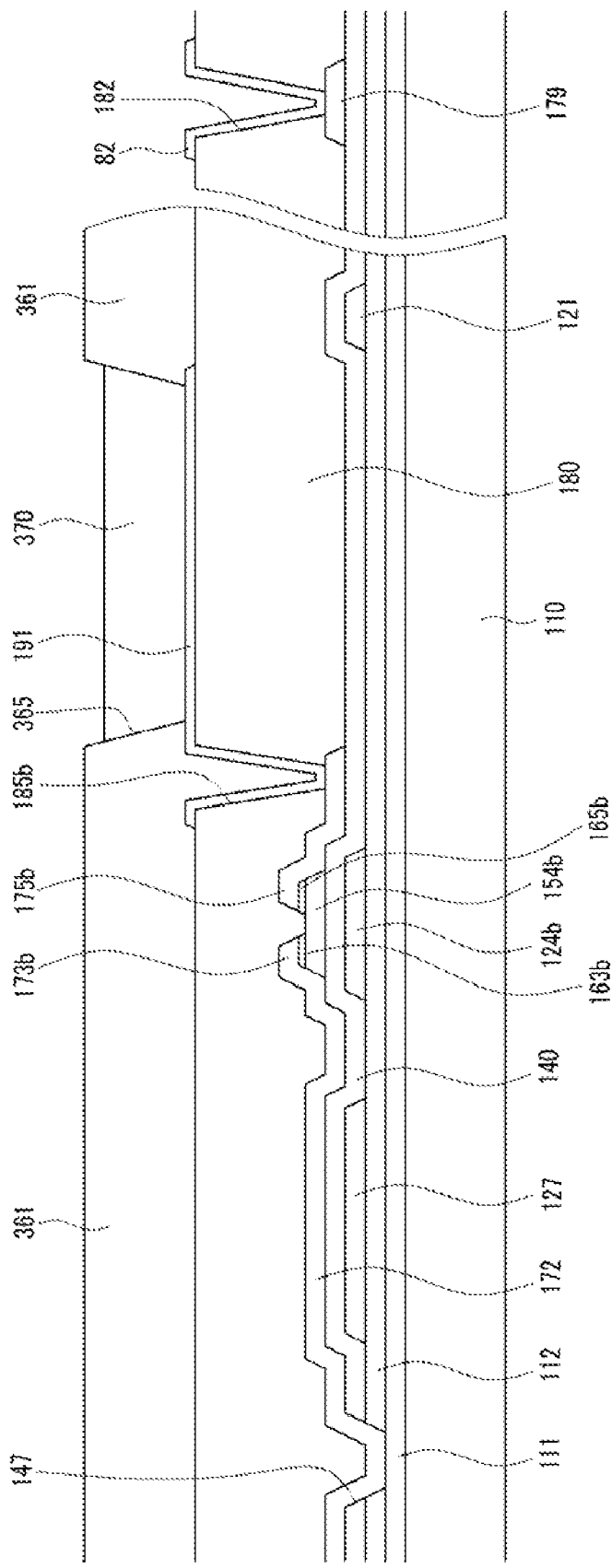

Referring to FIG. 14, FIG. 15, and FIG. 16, after depositing a photosensitive organic insulator using spin coating, the insulator is exposed and developed by photolithography to form a partition 361 having openings 365 on the pixel electrodes 191.

Thereafter, a plurality of organic light-emitting members 370, each of which includes an HTL (not shown) and a light-emitting layer (not shown), are formed on the pixel electrodes 191 and confined in the openings 365.

The organic light-emitting members 370 may be formed by a solution process such as an inkjet printing or a deposition process. The organic light-emitting members 370 may be formed by inkjet printing, which deposits a solution into the openings 365 while moving an inkjet head (not shown). In this case, a drying step for removing solvent follows the deposition process.

Next, referring to FIG. 2, FIG. 3, and FIG. 4, a common electrode 270 is formed on the partitions 361 and the organic light-emitting members 370.

A second exemplary embodiment of the present invention, of which portions are modified with respect to the above-described first exemplary embodiment, will be described below with reference to FIG. 17 and FIG. 18.

Figure 17:
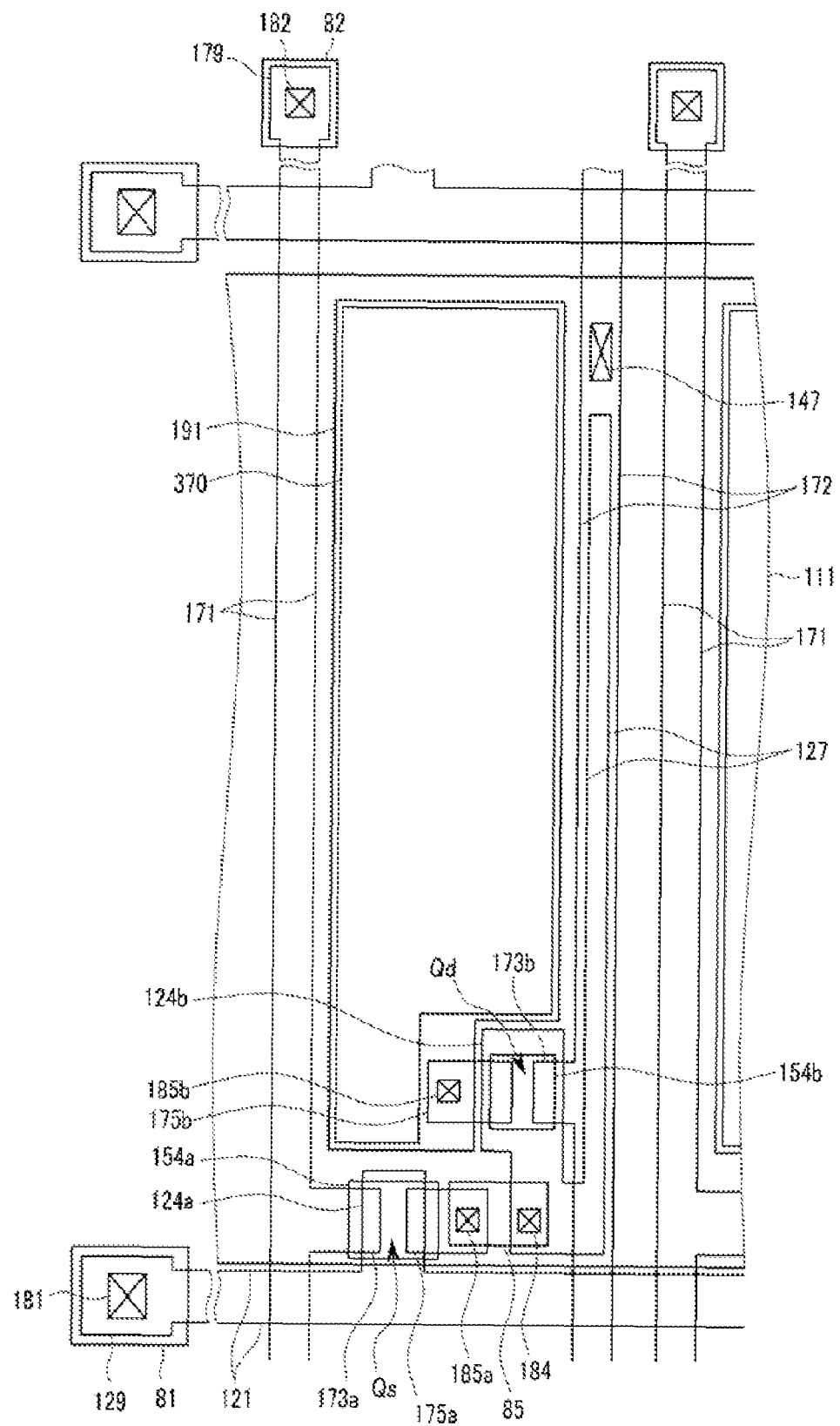
FIG. 17 and FIG. 18 are layout views of an OLED display according to a second exemplary embodiment of the present invention.
Figure 18:
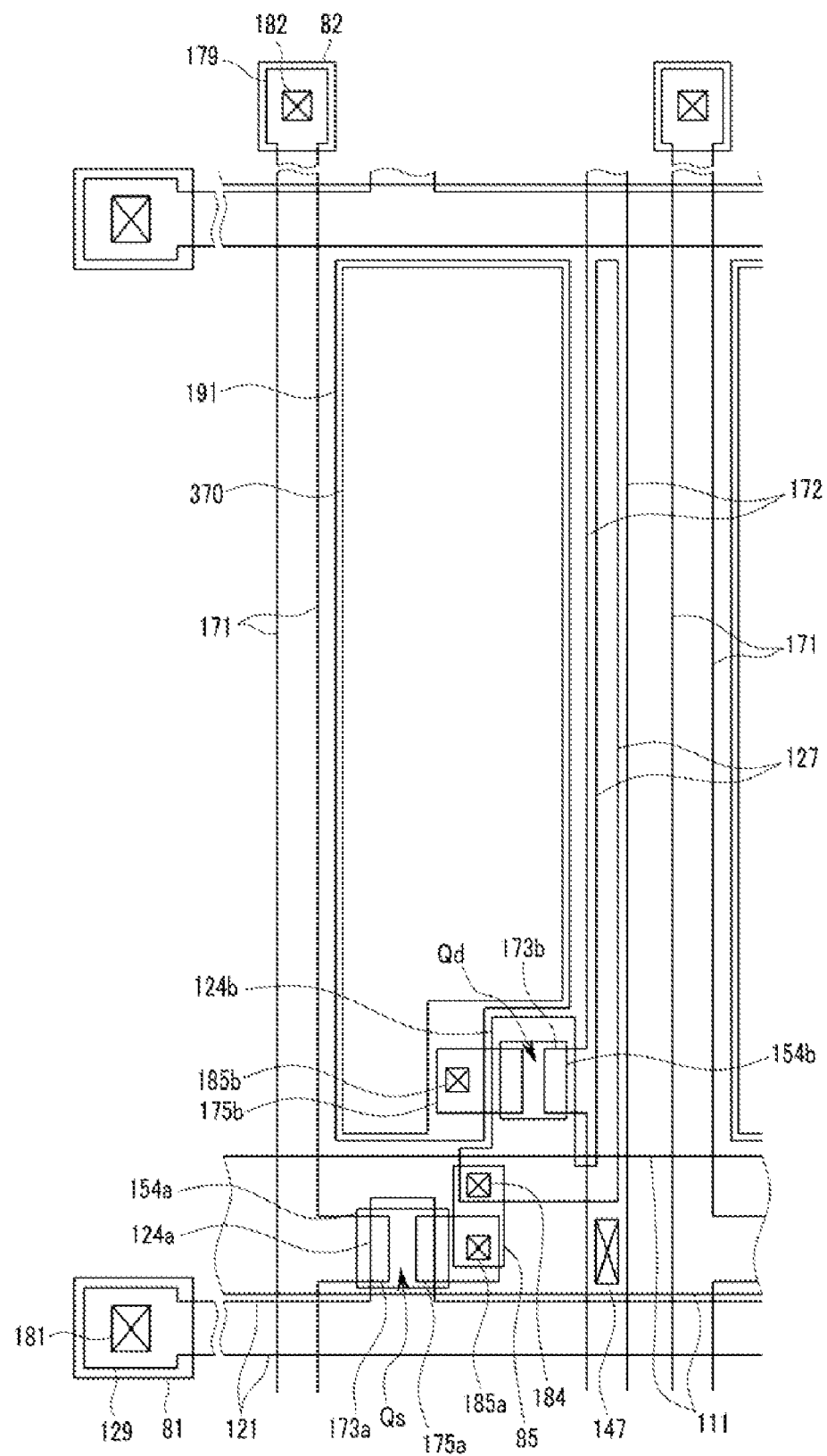

FIG. 17 and FIG. 18 are layout views showing an OLED display according to the second exemplary embodiment of the present invention.

Referring to FIG. 17, an auxiliary electrode 111 is formed so that it does not overlap the gate lines 121, as opposed to the first exemplary embodiment in which the auxiliary electrode 111 is formed on the entire surface of the mother substrate. Not overlapping the auxiliary electrode 111 and the gate lines 121 may prevent a short-circuit between the auxiliary electrode 111 and the gate lines 121.

Referring to FIG. 18, the auxiliary electrode 111 is formed between the gate lines 121 and the light-emitting regions, which correspond to the light-emitting layers of the organic light-emitting members 370. When the above structure is applied, even though the OLED is a bottom emission type, the light-emitting regions are not covered by the auxiliary electrode 111. Hence, the auxiliary electrode 111 may be an opaque conductor. Therefore, when the OLED is the bottom emission type, the auxiliary electrode 111 may be formed of a low resistivity conductor such as Al, Ag, Cu, or an alloy thereof, to reduce resistance.

The other elements except for the auxiliary electrode 111 are the same as those of the first exemplary embodiment. Detailed descriptions of the elements are therefore omitted.

An OLED display of a top-emission type according to a third exemplary embodiment of the present invention will be described below with reference to FIG. 19 and FIG. 20, as well as FIG. 1. Descriptions of the same elements as those of the above-described embodiments are omitted.

Figure 19:
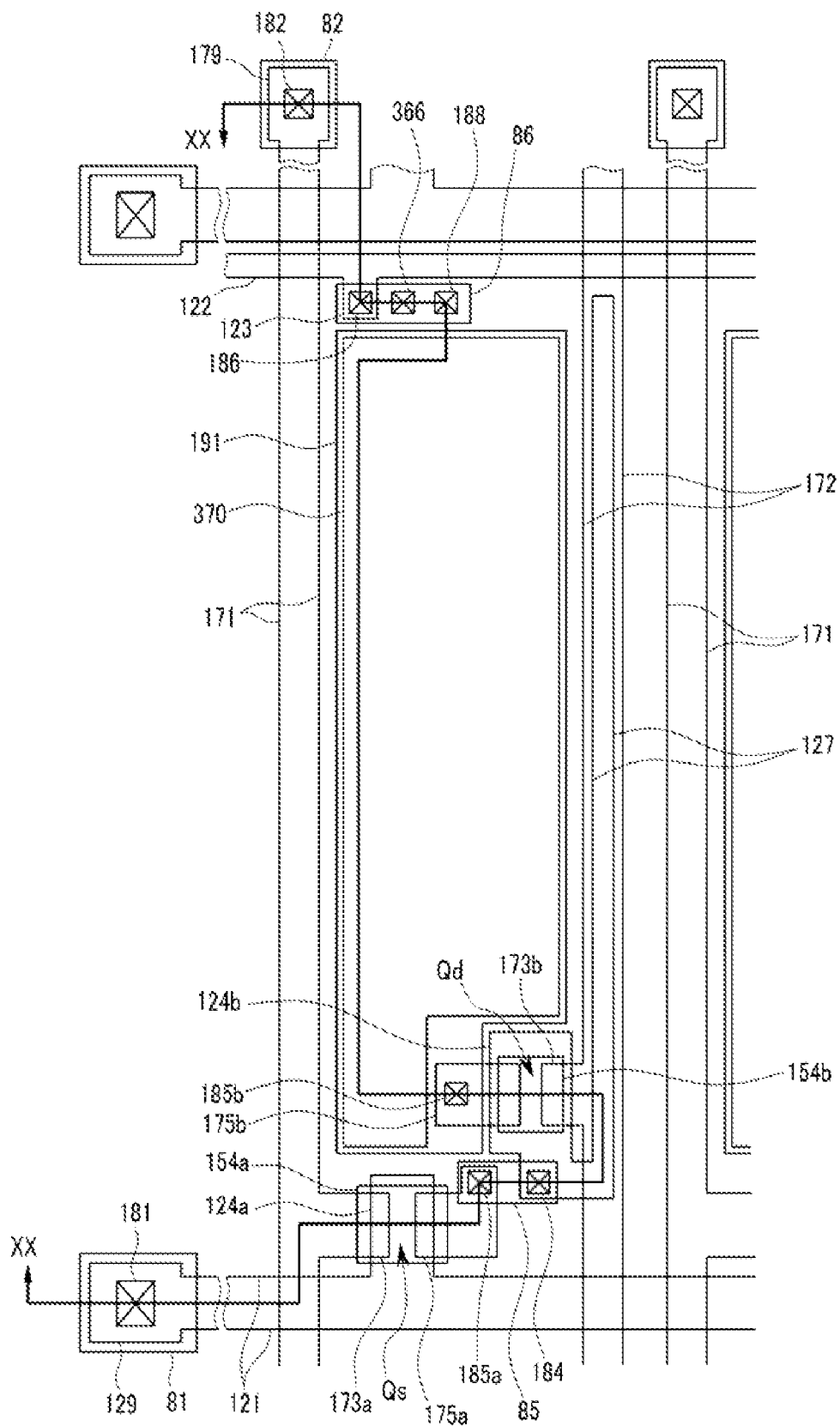
FIG. 19 is a layout view of an OLED display according to a third exemplary embodiment of the present invention.
Figure 20:
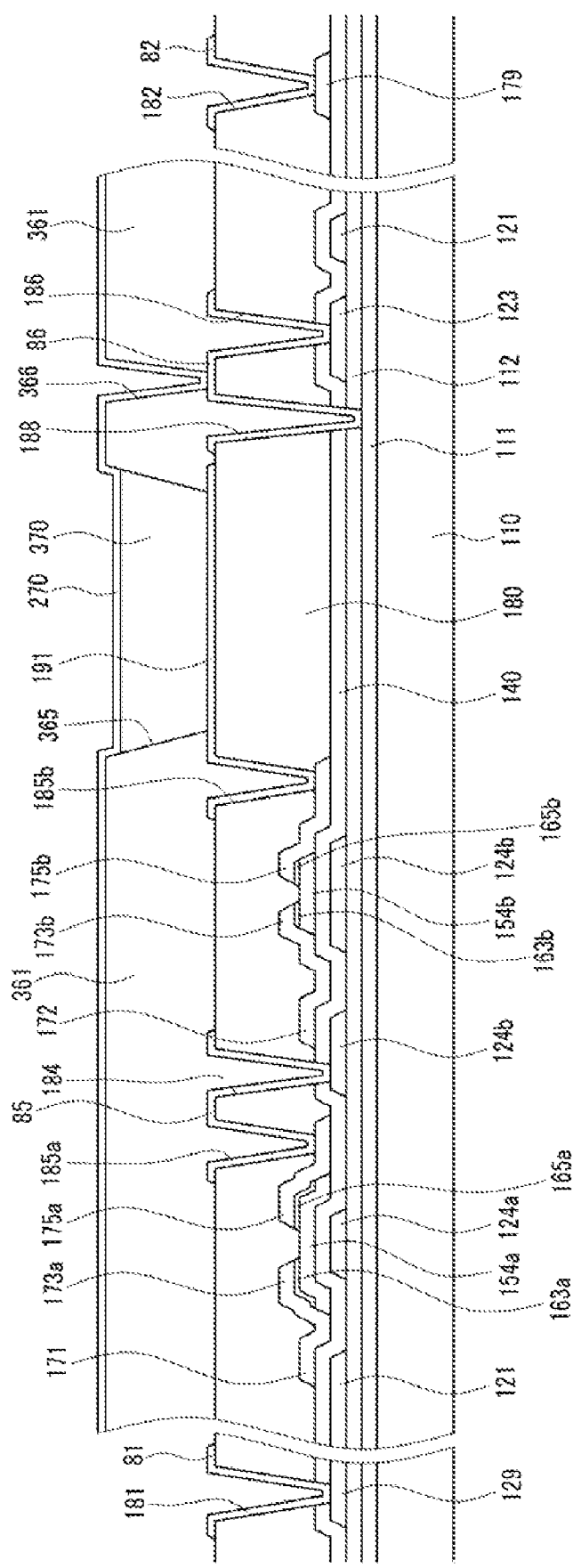
FIG. 20 is a sectional view of the OLED of FIG. 19 taken along line XX-XX.

FIG. 19 is a layout view of an OLED display according to a third exemplary embodiment of the present invention, and FIG. 20 is a sectional view taken along line XX-XX of FIG. 19.

An auxiliary electrode 111 is formed on an insulating substrate 110. The auxiliary electrode 111 may have a substantially planar shape, and it may cover the entire surface of a mother substrate (not shown). The auxiliary electrode 111 may be made of a low resistivity conductor including Al, Ag, Cu, or alloys thereof.

A blocking layer 112 is formed on the auxiliary electrode 111.

A plurality of gate conductors that include a plurality of gate lines 121, a plurality of second control electrodes 124b, and a plurality of voltage auxiliary lines 122 are formed on the blocking layer 112. The gate lines 121 include first control electrodes 124a, and the voltage auxiliary lines 122 include protrusions 123.

The voltage auxiliary lines 122 transmit a common voltage and extend substantially in parallel with the gate lines 121. The protrusions 123 extend downward from each auxiliary electrode line 122.

The gate insulating layer 140 is formed on the gate conductors 121, 124b, and 122.

A plurality of first and second semiconductor islands 154a and 154b are formed on the gate insulating layer 140. A plurality of pairs of first ohmic contact islands 163a and 165a and a plurality of pairs of second ohmic contact islands 163b and 165b are formed on the first and second semiconductor islands 154a and 154b, respectively.

A plurality of data conductors, which include a plurality of data lines 171, a plurality of driving voltage lines 172, and a plurality of first and second output electrodes 175a and 175b, are formed on the ohmic contacts 163a, 163b, 165a, and 165b and the gate insulating layer 140.

Unlike the above-described embodiments, the driving voltage lines 172 are not connected to the auxiliary electrode 111.

Alternatively, instead of forming the voltage auxiliary lines 122 on the same layer as the gate lines 121, the voltage auxiliary lines may be formed on the same layer as the data lines 171, the driving voltage lines 172, and the first and second output electrode 175a and 175b. In this case, the voltage auxiliary lines may extend substantially in parallel with the data lines 171.

A passivation layer 180 is formed on the data conductors 171, 172, 175a, and 175b, the exposed portions of the semiconductor islands 154a and 154b, and the gate insulating layer 140.

The passivation layer 180 has a plurality of contact holes 182, 185a, and 185b exposing the end portions 179 of the data lines 171, the first output electrodes 175a, and the second output electrodes 175b, respectively, and the passivation layer 180 and the gate insulating layer 140 have a plurality of contact holes 181, 184, and 186 exposing the end portions 129 of the gate lines 121, the second control electrodes 124b, and the protrusions 123 of the voltage auxiliary lines 122, respectively. Furthermore, the passivation layer 180, the gate insulating layer 140, and the blocking layer 112 have a plurality of contact holes 188 exposing the auxiliary electrode 111.

A plurality of pixel electrodes 191, a plurality of connecting members 85 and 86, and a plurality of contact assistants 81 and 82 are formed on the passivation layer 180.

They may have a single-layered structure, which may be made of an opaque conductor, or a double-layered structure of ITO and an opaque conductor. The opaque conductor may be made of Al, Au, Pt, Ni, Cu, W, or alloys thereof having a high work function.

The connecting members 85 are connected to the second control electrodes 124b and the first output electrodes 175a through the contact holes 184 and 185a, respectively.

The connecting members 86 are connected to the protrusions 123 of the voltage auxiliary lines 122 and the auxiliary electrodes 111 through the contact holes 186 and 188, respectively.

A partition 361, which has openings 365 and contact holes 366, is formed on the passivation layer 180, and a plurality of organic light-emitting members 370 are formed within the openings 365.

A common electrode 270 is formed on the entire surface of the substrate including the partition 361 and the organic light-emitting members 370. The common electrode 270 may be made of a transparent or translucent conductive material having a good electron injection characteristic and that does not negatively affect an organic material. Examples of the conductive materials include a 50 to 100 Å thick, single-layered structure of ITO, IZO, Al, and Ag, or a multi-layered structure of Ca—Ag, LiF—Al, Ca—Ba, and Ca—Ag-ITO. Because the common electrode 270 is made of transparent or translucent conductive material, light may be emitted toward the top of the substrate 110 on which thin film transistors are formed.

The common electrode 270 is connected to the protrusions 123 of the voltage auxiliary lines 122 through the contact holes 366 and the connecting members 86. Hence, the common electrode 270, the protrusions 123 of the voltage auxiliary lines 122, and the auxiliary electrode 111 are connected to each other.

Such connections may permit the common electrode 270 to stably supply a common voltage when the common electrode 270 is made of a high resistivity transparent or translucent conductive material. Consequently, the common voltage applied to the entire area of the common electrode 270 may be substantially uniform (i.e. without a voltage drop), to reduce cross-talk due to a luminance difference between pixels.

A fourth exemplary embodiment of the present invention, of which portions are modified with respect to the above described first embodiment of FIGS. 1 to 4, will be described below with reference to FIG. 21 and FIG. 22. The descriptions of the same elements as those of the above-described embodiments are omitted.

Figure 21:
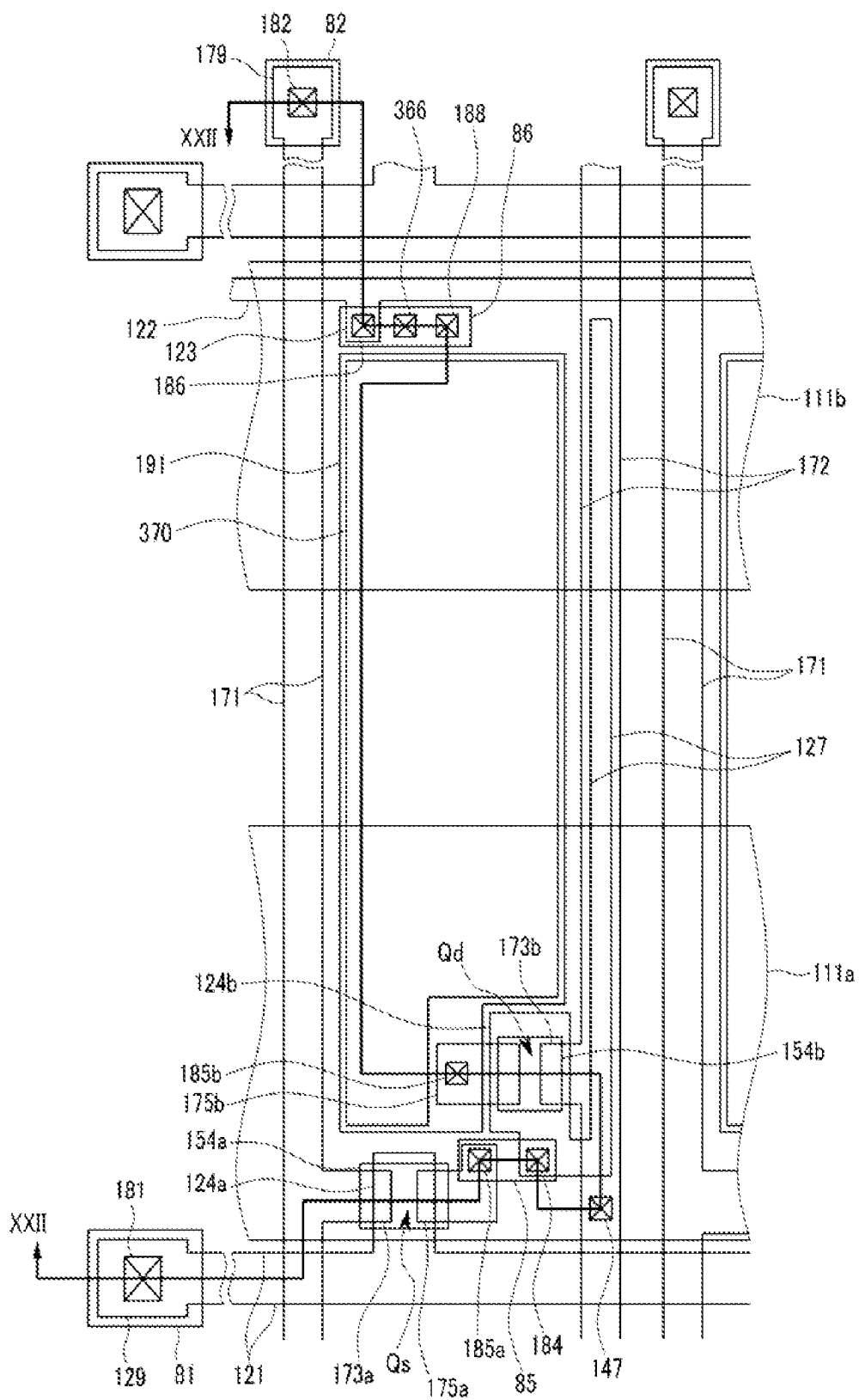
FIG. 21 is a layout view of an OLED display according to a fourth exemplary embodiment of the present invention.
Figure 22:
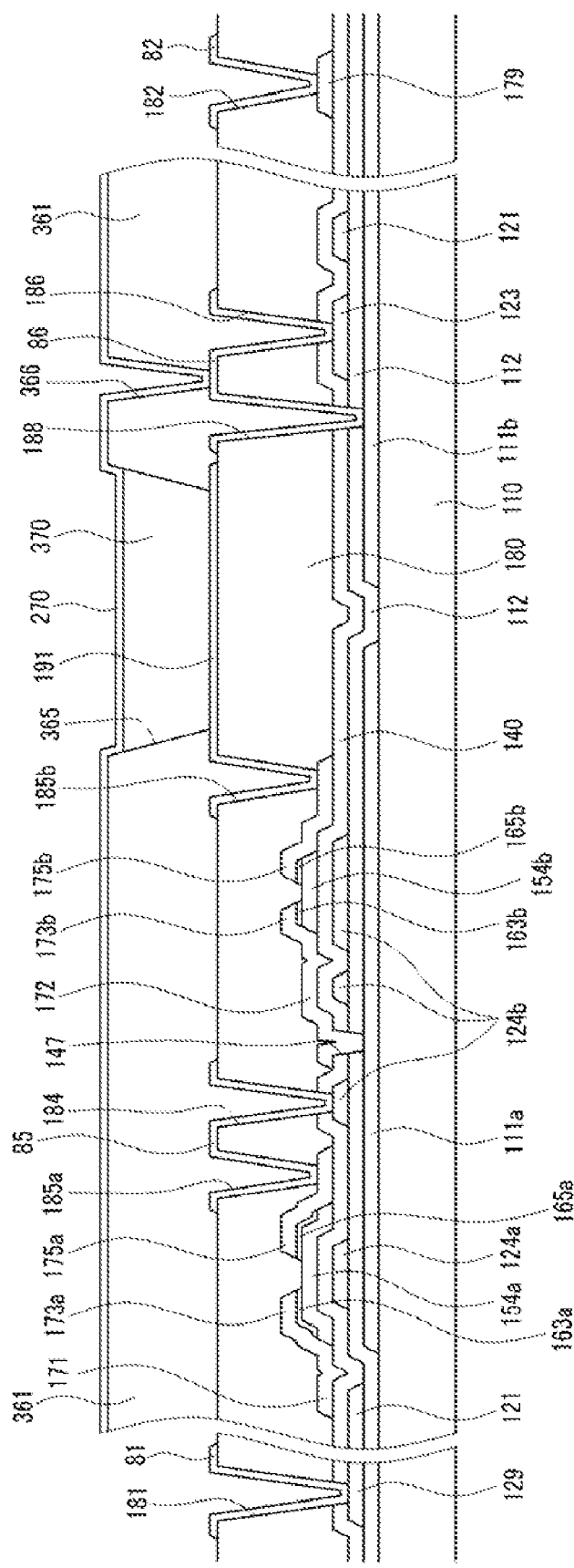
FIG. 22 is a sectional view of the OLED of FIG. 21 taken along line XXII-XXII.

FIG. 21 is a layout view of an OLED display according to a fourth exemplary embodiment of the present invention, and FIG. 22 is a sectional view taken along line XXII-XXII of FIG. 21.

Referring to FIG. 21 and FIG. 22, a first auxiliary electrode 111a and a second auxiliary electrode 111b are formed on an insulating substrate 110. The first and second auxiliary electrodes 111a and 111b are spaced apart from each other by a predetermined interval and have a substantially planar shape. The first and second auxiliary electrodes 111a and 111b may be made of a low resistivity conductor including Al, Ag, Cu, or alloys thereof.

A blocking layer 112 is formed on the first and second auxiliary electrodes 111a and 111b.

A plurality of gate conductors that include a plurality of gate lines 121, a plurality of second control electrodes 124b, and a plurality of voltage auxiliary lines 122 are formed on the blocking layer 112. The gate lines 121 include first control electrodes 124a, and the voltage auxiliary lines 122 include protrusions 123.

The gate insulating layer 140 is formed on the gate conductors 121, 124b, and 122.

The gate insulating layer 140 and the blocking layer 112 have a plurality of contact holes 147 exposing the first auxiliary electrode 111a.

A plurality of first and second semiconductor islands 154a and 154b are formed on the gate insulating layer 140. A plurality of pairs of first ohmic contact islands 163a and 165a and a plurality of pairs of second ohmic contact islands 163b and 165b are formed on the first and second semiconductor islands 154a and 154b, respectively.

A plurality of data conductors, which include a plurality of data lines 171, a plurality of driving voltage lines 172, and a plurality of first and second output electrodes 175a and 175b, are formed on the ohmic contacts 163a, 163b, 165a, and 165b and the gate insulating layer 140. The driving voltage lines 172 are connected to the first auxiliary electrode 111a though the contact holes 147.

A passivation layer 180 is formed on the data conductors 171, 172, 175a, and 175b, the exposed portions of the semiconductor islands 154a and 154b, and the gate insulating layer 140.

The passivation layer 180 has a plurality of contact holes 182, 185a, and 185b exposing the end portions 179 of the data lines 171, the first output electrodes 175a, and the second output electrodes 175b, respectively, and the passivation layer 180 and the gate insulating layer 140 have a plurality of contact holes 181, 184, and 186 exposing the end portions 129 of the gate lines 121, the second control electrodes 124b, and the protrusions 123 of the voltage auxiliary lines 122, respectively. Furthermore, the passivation layer 180, the gate insulating layer 140, and the blocking layer 112 have a plurality of contact holes 188 exposing the second auxiliary electrode 111b.

A plurality of pixel electrodes 191, a plurality of connecting members 85 and 86, and a plurality of contact assistants 81 and 82 are formed on the passivation layer 180.

The connecting members 85 are connected to the second control electrodes 124b and the first output electrodes 175a through the contact holes 184 and 185a, respectively.

The connecting members 86 are connected to the protrusions 123 of the voltage auxiliary lines 122 and the second auxiliary electrodes 111b through the contact holes 186 and 188, respectively.

A partition 361, which has openings 365 and contact holes 366, is formed on the passivation layer 180, and a plurality of organic light-emitting members 370 are formed within the openings 365.

A common electrode 270 is formed on the entire surface of the substrate including the partition 361 and the organic light-emitting members 370.

The common electrode 270 is connected to the protrusions 123 of the voltage auxiliary lines 122 through the contact holes 366 and the connecting members 86. Hence, the common electrode 270, the protrusions 123 of the voltage auxiliary lines 122, and the second auxiliary electrode 111b are connected to each other.

As described above, the first and second auxiliary electrodes 111a and 111b are formed on the substrate 110, the first auxiliary electrode 111a is connected to the driving voltage lines 172, and the second auxiliary electrodes 111b are connected to the common electrode 270. Accordingly, a driving voltage may be applied to the driving voltage lines 172 and the first auxiliary electrode 111a, and a common voltage may be applied to the common electrode 270 and the second auxiliary electrode 111b, so that the driving voltage and the common voltage may be uniformly applied to all pixels. Moreover, the first and second auxiliary electrodes 111a and 111b have sheet resistance. Hence, even though a voltage drop of the voltages applied to each of the pixels may occur, the voltages may not significantly vary because of compensation of the voltage drop by the sheet resistance. Accordingly, the driving voltage and the common voltage may be substantially uniformly applied to the pixels, and cross-talk due to luminance difference between pixels may decrease.

While the first and second auxiliary electrodes and the driving voltage lines or the common electrode are shown as being connected in a display area, they may alternatively be connected in other areas.

According to exemplary embodiments of the present invention, by forming at least one auxiliary electrode, a driving voltage and a common voltage may be substantially uniformly applied to the pixels, thereby decreasing cross-talk due to a luminance difference between pixels.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting diode (OLED) display, comprising:
   a substrate;
   a first auxiliary electrode disposed on the substrate;
   a first signal line disposed on the substrate;
   a second signal line crossing the first signal line;
   a driving voltage line connected to the first auxiliary electrode;
   a first thin film transistor connected to the first signal line and the second signal line;
   a second thin film transistor connected to the first thin film transistor and the driving voltage line;
   a first electrode connected to the second thin film transistor;
   a second electrode facing the first electrode; and
   a light-emitting member disposed between the first electrode and the second electrode,
   wherein the first auxiliary electrode does not overlap the first signal line.

2. The OLED display of claim 1, wherein the first auxiliary electrode is disposed on a layer different from the driving voltage line.

3. The OLED display of claim 1, further comprising a blocking layer disposed on the first auxiliary electrode.

4. The OLED display of claim 1, wherein the first auxiliary electrode covers the entire surface of the substrate.

5. The OLED display of claim 1, wherein the first auxiliary electrode comprises a transparent or translucent conductor.

6. The OLED display of claim 1, wherein the first auxiliary electrode is disposed corresponding to the light-emitting member.

7. The OLED display of claim 6, wherein the first auxiliary electrode comprises at least one of Al, an Al alloy, Cu, a Cu alloy, Ag, and an Ag alloy.

8. An organic light-emitting diode (OLED) display, comprising:
   a substrate;
   a first auxiliary electrode disposed on the substrate;
   a first signal line disposed on the substrate;
   a second signal line crossing the first signal line;
   a driving voltage line connected to the first auxiliary electrode;
   a first thin film transistor connected to the first signal line and the second signal line;
   a second thin film transistor connected to the first thin film transistor and the driving voltage line;
   a first electrode connected to the second thin film transistor; a second electrode facing the first electrode;
   a light-emitting member disposed between the first electrode and the second electrode; and
   a second auxiliary electrode spaced apart from the first auxiliary electrode,
   wherein the second auxiliary electrode is connected to the second electrode.

9. The OLED display of claim 8, wherein the first auxiliary electrode and the second auxiliary electrode are disposed on the same layer.

10. The OLED display of claim 8, wherein the second auxiliary electrode receives a voltage having the same magnitude as what the second electrode receives.

11. The OLED display of claim 8, further comprising a voltage auxiliary line disposed on the same layer as the first signal line or the second signal line, the voltage auxiliary line being connected to the second electrode and the second auxiliary electrode.

12. The OLED display of claim 8, wherein the second electrode comprises a transparent or translucent conductor.

13. The OLED display of claim 12, wherein the second electrode comprises indium tin oxide or indium zinc oxide.

14. The OLED display of claim 8, further comprising a partition, the light-emitting member being disposed in an opening of the partition.

15. An organic light-emitting diode (OLED) display, comprising:
   a substrate;
   an auxiliary electrode disposed on the substrate;
   a first signal line disposed on the substrate;
   a second signal line crossing the first signal line;
   a first thin film transistor connected to the first signal line and the second signal line;
   a second thin film transistor connected to the first thin film transistor;
   a first electrode connected to the second thin film transistor;
   a second electrode facing the first electrode and
   a light-emitting member disposed between the first electrode and the second electrode,
   wherein the second electrode is connected to the auxiliary electrode through a connecting member.

16. The OLED display of claim 15, further comprising a voltage auxiliary line disposed on the same layer as the first signal line or the second signal line, the voltage auxiliary line being connected to the second electrode.

17. The OLED display of claim 15, wherein the second electrode comprises a transparent or translucent conductor.

18. The OLED display of claim 17, wherein the second electrode comprises indium tin oxide or indium zinc oxide.

* * * * *